US012748457B2

(12) United States Patent
Lee et al.

(10) Patent No.: US 12,748,457 B2
(45) Date of Patent: Sep. 29, 2026

(54) HINGE MODULE AND ELECTRONIC DEVICE COMPRISING SAME

(71) Applicant: SAMSUNG ELECTRONICS CO., LTD., Suwon-si (KR)

(72) Inventors: Giyun Lee, Suwon-si (KR); Jungjin Kim, Suwon-si (KR); Hyungsoo Kim, Suwon-si (KR); Iksu Jung, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 143 days.

(21) Appl. No.: 18/232,480

(22) Filed: Aug. 10, 2023

(65) Prior Publication Data

US 2023/0384822 A1 Nov. 30, 2023

Related U.S. Application Data

(63) Continuation of application No. PCT/KR2022/002024, filed on Feb. 10, 2022.

(30) Foreign Application Priority Data

Feb. 10, 2021 (KR) ........................ 10-2021-0019325

(51) Int. Cl.
*G06F 1/16* (2006.01)
*H05K 5/02* (2006.01)

(52) U.S. Cl.
CPC .......... *G06F 1/1618* (2013.01); *G06F 1/1652* (2013.01); *G06F 1/1681* (2013.01); *H05K 5/0226* (2013.01)

(58) Field of Classification Search
CPC .... G06F 1/1618; G06F 1/1652; G06F 1/1681; H05K 5/0226
See application file for complete search history.

(56) References Cited

U.S. PATENT DOCUMENTS

2004/0203527 A1 10/2004 Matsumoto
2015/0233162 A1 8/2015 Lee et al.
(Continued)

FOREIGN PATENT DOCUMENTS

EP 4 216 520 A1 7/2023
KR 10-2004-0010123 A 1/2004
(Continued)

OTHER PUBLICATIONS

International Search Report dated May 19, 2022, issued by the International Searching Authority in International Application No. PCT/KR2022/002024 (PCT/ISA/210).
(Continued)

*Primary Examiner* — Sagar Shrestha
*Assistant Examiner* — Peter Krim
(74) *Attorney, Agent, or Firm* — Sughrue Mion, PLLC

(57) ABSTRACT

A foldable electronic device includes: a first housing; a second housing; a hinge module foldably coupling the first housing and the second housing with each other; and a flexible display disposed on a first surface of the first housing and a second surface of the second housing, and extending between the first surface and the second surface across the hinge module, wherein the hinge module includes: a gear member; a first rotation bracket rotatably connected to the gear member; a second rotation bracket rotatably connected to the gear member; a first hinge plate rotatably connected to the first rotation bracket; and a second hinge plate rotatably connected to the second rotation bracket.

11 Claims, 13 Drawing Sheets

(56) References Cited

U.S. PATENT DOCUMENTS

| | | | | |
|---|---|---|---|---|
| 2019/0166703 | A1* | 5/2019 | Kim | H04M 1/0268 |
| 2019/0369668 | A1* | 12/2019 | Kim | H10K 59/87 |
| 2019/0369671 | A1 | 12/2019 | Seo et al. | |
| 2020/0166974 | A1* | 5/2020 | Ai | H04M 1/0216 |
| 2020/0236203 | A1 | 7/2020 | Carlson et al. | |
| 2020/0267858 | A1 | 8/2020 | Kim et al. | |
| 2020/0348732 | A1 | 11/2020 | Kang et al. | |
| 2020/0383220 | A1 | 12/2020 | Kang et al. | |
| 2021/0368032 | A1* | 11/2021 | Liao | G06F 1/1681 |
| 2022/0061175 | A1 | 2/2022 | Oh et al. | |
| 2022/0129046 | A1 | 4/2022 | Baek et al. | |
| 2022/0303371 | A1* | 9/2022 | Liao | H04M 1/0268 |
| 2022/0308634 | A1* | 9/2022 | Hou | G06F 1/1681 |
| 2022/0342458 | A1 | 10/2022 | Ai et al. | |
| 2023/0403347 | A1* | 12/2023 | Liu | G06F 1/1681 |
| 2023/0409090 | A1* | 12/2023 | Hong | G09F 9/30 |
| 2024/0069604 | A1* | 2/2024 | Xu | G06F 1/1652 |

FOREIGN PATENT DOCUMENTS

| | | | |
|---|---|---|---|
| KR | 10-2017-0077096 | A | 7/2017 |
| KR | 10-2018-0030435 | A | 3/2018 |
| KR | 10-2018-0107358 | A | 10/2018 |
| KR | 10-2020-0018176 | A | 2/2020 |
| KR | 10-2020-0072190 | A | 6/2020 |
| KR | 10-2020-0091809 | A | 7/2020 |
| KR | 10-2020-0100490 | A | 8/2020 |
| KR | 10-2020-0101229 | A | 8/2020 |
| KR | 10-2020-0126524 | A | 11/2020 |
| KR | 10-2020-0138948 | A | 12/2020 |
| KR | 10-2022-0098945 | A | 7/2022 |
| WO | 2020/186889 | A1 | 9/2020 |

OTHER PUBLICATIONS

Written Opinion dated May 19, 2022, issued by the International Searching Authority in International Application No. PCT/KR2022/002024 (PCT/ISA/237).

Communication issued on Jun. 21, 2024 by the European Patent Office for European Patent Application No. 22752997.1.

Communication issued Mar. 4, 2025 by the Korean Intellectual Property Office in Korean Patent Application No. 10-2021-0019325.

Communication dated Oct. 23, 2025, issued by the Korean Intellectual Property Office in Korean Application No. 10-2021-0019325.

* cited by examiner

HINGE MODULE AND ELECTRONIC DEVICE COMPRISING SAME

CROSS-REFERENCE TO RELATED APPLICATIONS

This application is a by-pass continuation of International Application No. PCT/KR2022/002024, filed on Feb. 10, 2022, which is based on and claims priority to Korean Patent Application No. 10-2021-0019325, filed on Feb. 10, 2021, in the Korean Intellectual Property Office, the disclosures of which are incorporated by reference herein in their entireties.

BACKGROUND

1. Field

The disclosure relates to an electronic device, for example, a hinge module and/or an electronic device including the same.

2. Description of Related Art

Along with the development of electronics, information, and communication technologies, various functions are being integrated into a single electronic device. For example, a smartphone includes the function of an audio player, an imaging device, or an electronic wallet function as well as a communication function, and more various functions may be implemented in the smartphone by installing additional applications.

A user may search, select, and obtain more information by accessing a network, not limited to functions (e.g., applications) or information installed in an electronic device. Although a direct access scheme (e.g., wired communication) may provide fast and stable communication establishment in accessing a network, its use area may be limited to a fixed location or a space of a certain size. A wireless communication scheme has fewer limitations on location and space in accessing a network, and its transmission speed and stability are gradually reaching the same level as the direct access scheme. It is expected that the wireless communication scheme will provide faster and more stable communication establishment than the direct access scheme.

As the use of personal and portable electronic devices such as smartphones becomes common, user demands for portability and convenience of use have been increasing. For example, a touch screen display may be an output device that outputs, for example, visual information on a screen and also provide a virtual keypad that replaces a physical input device (e.g., a keypad). Accordingly, the electronic device may provide the same or improved usability (e.g., a larger screen) while being miniaturized. It is expected that commercialization of a flexible display, for example, a foldable or rollable display will lead to more improved portability and use convenience of electronic devices.

In implementing a foldable or rollable electronic device, it may be difficult to secure mechanical stability while enabling structures of the electronic device to move (e.g., rotate) relative to each other. For example, it may be difficult to secure a stable operating mechanism in a foldable or rollable electronic device, while securing or maintaining the portability of the electronic device by making it small and lightweight. Particularly, a mechanical structure (e.g., a hinge or a roller) for providing a mechanism of folding or rolling a display and/or an electronic device may become another obstacle to miniaturization of the electronic device.

SUMMARY

Provided are a miniaturized hinge module for enabling deformation (e.g., folding or unfolding deformation) of a display, and an electronic device including the same.

According to an aspect of the disclosure, a foldable electronic device includes: a first housing; a second housing; a hinge module foldably coupling the first housing and the second housing with each other; and a flexible display disposed on a first surface of the first housing and a second surface of the second housing, and extending between the first surface and the second surface across the hinge module, wherein the hinge module includes: a gear member; a first rotation bracket rotatably connected to the gear member; a second rotation bracket rotatably connected to the gear member; a first hinge plate rotatably connected to the first rotation bracket; and a second hinge plate rotatably connected to the second rotation bracket.

The gear member may include a first rotation axis configured to rotate the first housing therearound and a second rotation axis configured to rotate the second housing rotate therearound.

The gear member may further include: a first gear aligned with the first rotation axis; a second gear aligned with the second rotation axis; and an interlocking gear interlocking the first gear and the second gear with each other.

The gear member may further include a fixing bracket configured to fix a position of the first gear by accommodating at least a part of the first gear and to fix a position of the second gear by accommodating at least a part of the second gear.

The foldable electronic device may further include a first pin member fastening the fixing bracket to the first rotation bracket and the second rotation bracket.

Each of the first rotation bracket and the second rotation bracket may include a base and a plurality of arms.

Each of the first rotation bracket and the second rotation bracket may further include a fastening member protruding from one surface of the base in a longitudinal direction of the electronic device and fastening the first hinge plate and the second hinge plate to each other.

The fastening member of the first rotation bracket forms a third rotation axis to rotate the first hinge plat thereabout and the fastening member of the second rotation bracket forms a fourth rotation axis to rotate the second hinge plate therearound.

Each of the first rotation bracket and the second rotation bracket may further include: a first arm protruding from a surface of the base in a longitudinal direction of the electronic device; and a second arm extending from the first arm in a direction parallel to the surface of the base.

The second arm of each of the first rotation bracket and the second rotation bracket may include a guide pin hole formed in a surface of the second arm.

The hinge module may further include a first hinge arm configured to rotate the first rotation bracket and a second hinge arm configured to rotate the second rotation bracket, in response to an unfolding or a folding of the first housing and the second housing.

The foldable electronic device of claim 11, further including a pair of second pin members respectively fastening the first hinge arm and the second hinge arm to the guide pin hole of the first rotation bracket and the guide pin hole of the second rotation bracket.

The gear member may include: a first gear including a first teeth portion and a first shaft connected to the first teeth portion; and a second gear including a second teeth portion and a second shaft connected to the second teeth portion, the first hinge arm and the second hinge arm are fixedly connected to the first shaft and the second shaft, respectively, and the first hinge arm and the second hinge arm are fixed by press-fitting of an asymmetric cross-sectional structure of an end of the first shaft and an asymmetric cross-sectional structure of an end of the second shaft.

The first hinge plate and the second hinge plate may be at least partially supported by a hinge cover of the hinge module, when the electronic device is in an unfolded state.

Each of the first hinge plate and the second hinge plate is configured to rotate using a rotation axis different from a rotation axis around which the first housing and the second housing rotate, and the rotation axis around which the first hinge plate and the second hinge plate are rotatable is located on a rear surface of the flexible display.

According to one or more embodiments of the disclosure, a space between a first housing and a second housing, in which a flexible display is foldable, may be increased in a folded state of an electronic device by applying a behavior of retracting a hinge plate into an electronic device housing.

According to one or more embodiments of the disclosure, a foldable radius of curvature of the flexible display may be advantageously larger.

According to one or more embodiments of the disclosure, the flexible display may be implemented in the shape of a water droplet, when its cross-section is viewed.

According to one or more embodiments of the disclosure, a mounting space for internal components of the electronic device may be advantageously increased by reducing the width of a hinge module.

According to one or more embodiments of the disclosure, because it is possible to reduce the width of the hinge module, an area over which an adhesive is attached to a plate supporting the display may be formed to be larger. Accordingly, the durability of the electronic device may be improved.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION

Figure 1:
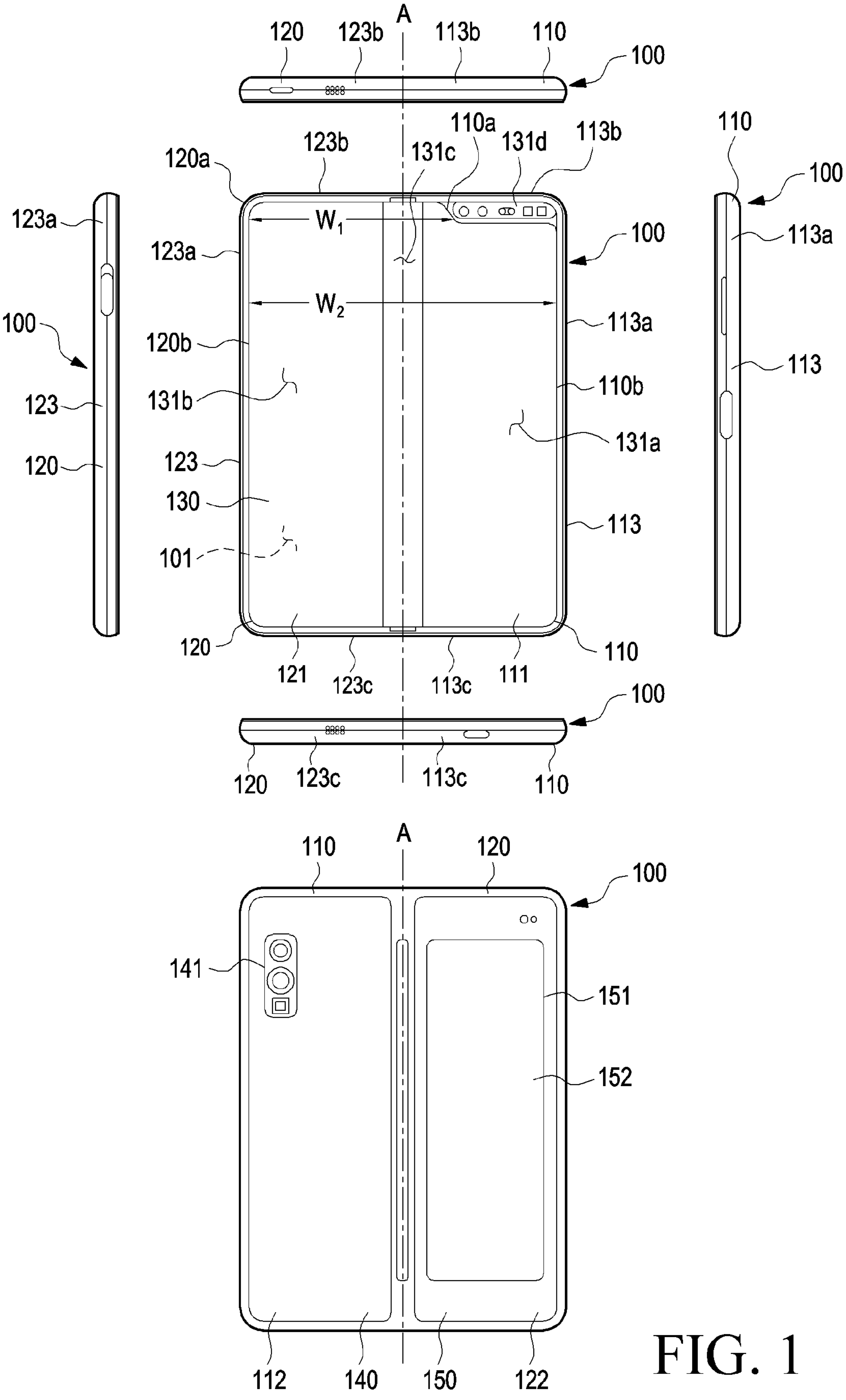
FIG. 1 is a diagram illustrating an electronic device in an unfolded state according to one or more embodiments of the disclosure.

An electronic device according to various embodiments of the disclosure may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B", "at least one of A and B", "at least one of A or B", "A, B, or C", "at least one of A, B, and C", and "at least one of A, B, or C" may include any one of, or all possible combinations of, the items enumerated together in a corresponding one of the phrases. As used herein, such terms as "1st" and "2nd" or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with", "coupled to", "connected with", or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, logic, logic block, part, or circuitry. A module may be a single integral component, or a minimum unit or part thereof, adapted to perform one or more functions.

Figure 2:
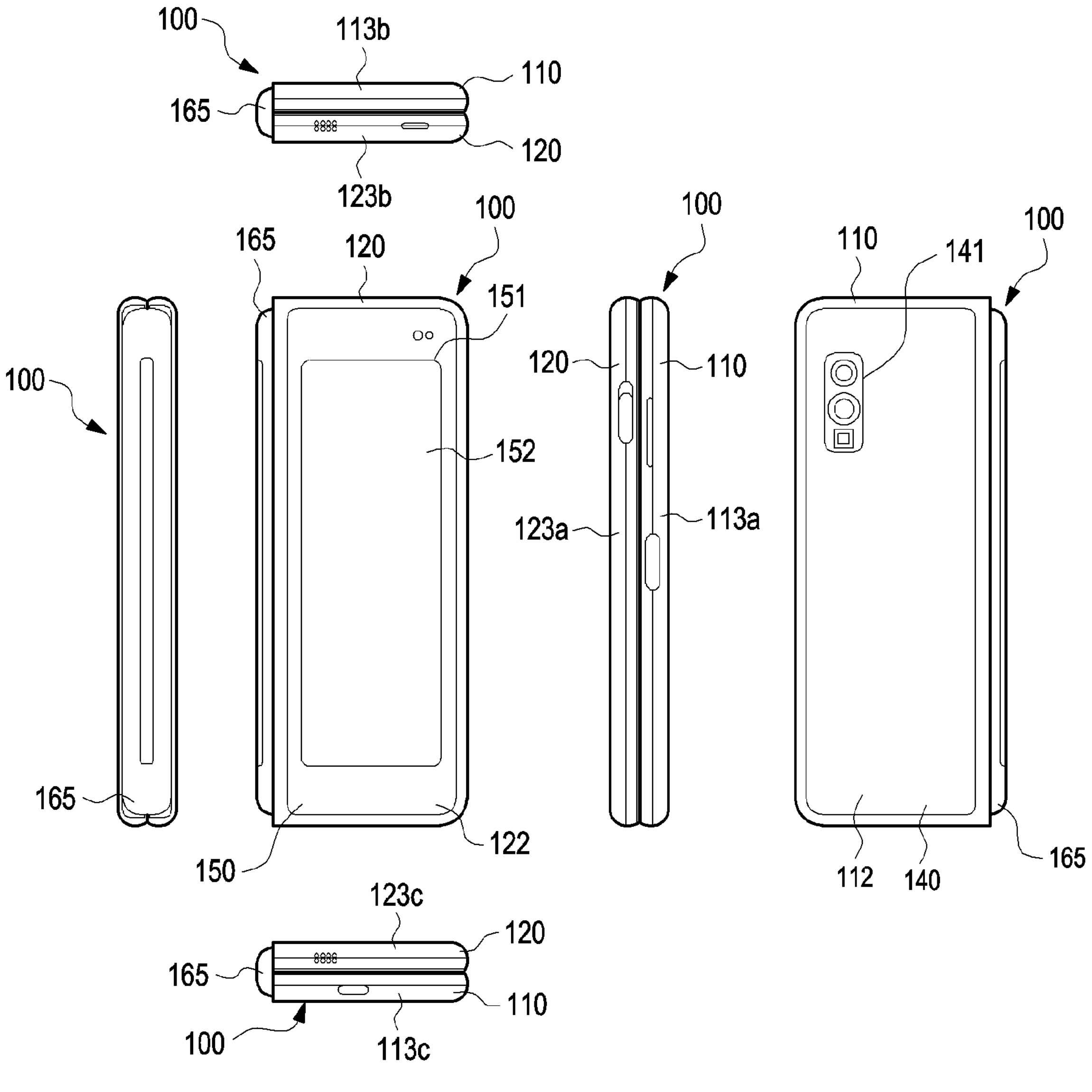
FIG. 2 is a diagram illustrating the electronic device of FIG. 1 in a folded state according to one or more embodiments of the disclosure.

FIG. 1 is a diagram illustrating an electronic device 100 in an unfolded state according to one or more embodiments of the disclosure. FIG. 2 is a diagram illustrating the electronic device 100 in a folded state according to one or more embodiments of the disclosure.

In the following detailed description, a configuration in which a pair of housing structures (or referred to as 'housings') are rotatably coupled with each other by a hinge module (or referred to as a 'hinge structure') is taken as an example. However, it should be noted that this embodiment does not limit an electronic device according to various embodiments of the disclosure. For example, the electronic device according to one or more embodiments of the disclosure may include three or more housing structures, and "a pair of housing structures" in the embodiments disclosed below may mean "two housing structures rotatably coupled with each other among three or more housing structures".

Referring to FIG. 1, the electronic device 100 may include a pair of housing structures 110 and 120 that are rotatably coupled by a hinge structure (e.g., a hinge structure 164 of FIG. 3) to be folded with respect to each other, a hinge cover 165 that covers foldable portions of the pair of housing structures 110 and 120, and a display 130 (e.g., a flexible display or a foldable display) disposed in a space formed by the pair of housing structures 110 and 120. In an embodiment, the electronic device 100 may include a foldable housing in which the pair of housing structures 110 and 120 are connected to be rotatable from a position at which the pair of housing structures 110 and 120 face each other to a position at which the pair of housing structures 110 and 120 are unfolded in parallel with each other. Herein, a surface on which the display 130 is disposed may be defined as a front surface of the electronic device 100, and a surface opposite to the front surface may be defined as a rear surface of the electronic device 100. A surface surrounding a space between the front and rear surfaces may be defined as a side surface of the electronic device 100.

In an embodiment, the pair of housing structures 110 and 120 may include a first housing structure 110 including a sensor area 131*d*, a second housing structure 120, a first rear cover 140, and a second rear cover 150. The pair of housing structures 110 and 120 of the electronic device 100 may be configured in a different shape or by a combination and/or engagement of other components, not limited to the shape and engagement illustrated in FIGS. 1 and 2. For example, in another embodiment, the first housing structure 110 and the first rear cover 140 may be integrally formed, and the second housing structure 120 and the second rear cover 150 may be integrally formed. In another embodiment, the first housing structure 110 may include the first rear cover 140, and the second housing structure 120 may include the second rear cover 150.

According to an embodiment, the first housing structure 110 and the second housing structure 120 may be disposed, for example, on both sides of a folding axis A, and may be symmetrical in shape as a whole with respect to the folding axis A. In a certain embodiment, the first housing structure 110 and the second housing structure 120 may rotate around different folding axes with respect to the hinge structure 164 or the hinge cover 165. For example, each of the first housing structure 110 and the second housing structure 120 may be rotatably coupled with the hinge structure 164 or the hinge cover 165. As the first housing structure 110 and the second housing structure 120 rotate around the folding axis A or different folding axes, the first housing structure 110 and the second housing structure 120 may rotate between a folded position and a position at which they are inclined with respect to each other or a position at which they are unfolded in parallel with each other.

Herein, the expression "located side by side" or "extended side by side" may mean a state in which two structures (e.g., the housing structures 110 and 120) are at least partially located next to each other or a state in which parts of the two structures, located next to each other are arranged in parallel. In a certain embodiment, "arranged side by side" may mean that the two structures are disposed next to each other, facing parallel directions or the same direction. Although expressions such as "side by side" and "parallel" may be used in the following detailed description, they will be easily understood according to the shapes or arrangement relationship of the structures with reference to the accompanying drawings.

According to an embodiment, the angle or distance between the first housing structure 110 and the second housing structure 120 may vary depending on whether the electronic device 100 is in an unfolded state (extended state or flat state) (or opened state), a folded state (or closed state), or an intermediate state. In describing various embodiments of the disclosure, when it is said that the electronic device 100 is placed in the "unfolded state", this may mean a "fully unfolded state" in which the first housing structure 110 and the second housing structure 120 of the electronic device 100 form an angle of 180 degrees. When it is said that the electronic device 100 is placed in the "closed state", this may mean that the first housing structure 110 and the second housing structure 120 of the electronic device form an angle of 0 degrees or an angle less than 10 degrees. When the electronic device 100 is placed in the "intermediate state", this may mean that the first housing structure 110 and the second housing structure 120 form an angle between the angle formed in the "unfolded state" and the angle formed in the "closed state".

According to an embodiment, while the first housing structure 110 further includes the sensor area 131*d* having various sensors arranged therein, unlike the second housing structure 120, the first housing structure 110 and the second housing structure 120 may be symmetrical with each other in shape in the remaining area except for the sensor area 131*d*. In another embodiment, the sensor area 131*d* may be additionally disposed in or replaced by at least a partial area of the second housing structure 120. In another embodiment, the sensor area 131*d* may be omitted in the first housing structure 110.

In an embodiment, in the unfolded state of the electronic device 100, the first housing structure 110 may be connected to the hinge structure (e.g., the hinge structure 164 of FIG. 3), and include a first surface 111 facing the front surface of the electronic device 100, a second surface 112 facing in the opposite direction to the first surface 111, and a first side member 113 at least partially surrounding a space between the first surface 111 and the second surface 112. In an embodiment, the first side member 113 may include a first side surface 113*a* disposed in parallel with the folding axis A, a second side surface 113*b* extending from one end of the first side surface 113*a* in a direction perpendicular to the folding axis A, and a third side surface 113*c* extending from the other end of the first side surface 113*a* in the direction perpendicular to the folding axis A. In the description of various embodiments of the disclosure, an expression such as "parallel" or "perpendicular" is used to describe the arrangement relationship of the above-described side surfaces. However, the expression encompasses the meaning of "partially parallel" or "partially perpendicular" according to an embodiment. In a certain embodiment, the expression "parallel" or "perpendicular" may mean an inclined arrangement relationship within an angle range of 10 degrees.

In an embodiment, the second housing structure 120 may be connected to the hinge structure (e.g., the hinge structure 164 of FIG. 3) and include a third surface 121 facing the front surface of the electronic device 100, a fourth surface 122 facing in the opposite direction to the third surface 121, and a second side member 123 at least partially surrounding a space between the third surface 121 and the fourth surface 122, in the unfolded state of the electronic device 100. In an embodiment, the second side member 123 may include a fourth side surface 123*a* disposed in parallel to the folding axis A, a fifth side surface 123*b* extending from one end of the fourth side surface 123*a* in the direction perpendicular to the folding axis A, and a sixth side surface 123*c* extending from the other end of the fourth side surface 123*a* in the direction perpendicular to the folding axis A. In an embodiment, the third surface 121 may be disposed to face the first surface 111 in the folded state. In a certain embodiment, although there is some difference in specific shapes, the second side member 123 may be formed into substantially the same shape as the first side member 113 or may be formed of substantially the same material as the first side member 113.

In an embodiment, the electronic device 100 may include a recess 101 formed to accommodate the display 130 therein through structural shape coupling between the first housing structure 110 and the second housing structure 120. The recess 101 may have substantially the same size as the display 130. In an embodiment, the recess 101 may have two or more different widths in the direction perpendicular to the folding axis A due to the sensor area 131*d*. For example, the recess 101 may have a first width W1 between a first part 120*a* of the second housing structure 120 parallel to the folding axis A and a first part 110*a* of the first housing structure 110, formed at an edge of the sensor area 131*d*, and a second width W2 between a second part 110*b* of the second housing structure 120 and a second part 110*b* of the first housing structure 110, which does not correspond to the sensor area 131*d* and is parallel to the folding axis A. In this case, the second width W2 may be greater than the first width W1. For example, the recess 101 may be formed to have the first width W1 covering the first part 110*a* of the first housing structure 110 and the first part 120*a* of the second housing structure 120 which are asymmetrical to each other, and the second width W2 covering the second part 110*b* of the first housing structure 110 and the second part 120*b* of the second housing structure 120 which are symmetrical to each other. In an embodiment, the first part 110*a* and the second part 110*b* of the first housing structure 110 may be formed to have different distances from the folding axis A. The widths of the recess 101 are not limited to the illustrated example. In one or more embodiments, the recess 101 may have two or more different widths according to the shape of the sensor area 131*d* or the asymmetrical parts of the first housing structure 110 and the second housing structure 120.

In an embodiment, the first housing structure 110 and the second housing structure 120 may be at least partially formed of a metallic material or a non-metallic material, which has a rigidity selected to support the display 130. In another embodiment, at least parts of the first housing structure 110 and the second housing structure 120 may contain an electrically conductive material. When the first housing structure 110 and the second housing structure 120 contain the electrically conductive material, the electronic device 100 may transmit and receive radio waves by means of the parts of the electrically conductive material in the first housing structure 110 and the second housing structure 120. For example, a processor or a communication module of the electronic device 100 may perform wireless communication by using the parts of the first housing structure 110 and the second housing structure 120.

In an embodiment, the sensor area 131*d* may be formed to have a predetermined area adjacent to one corner of the first housing structure 110. However, the arrangement, shape, or size of the sensor area 131*d* is not limited to the illustrated example. For example, in another embodiment, the sensor area 131*d* may be provided in any area adjacent to another corner of the first housing structure 110 or in any area between top and bottom corners of the first housing structure 110. In another embodiment, the sensor area 131*d* may be disposed in at least a partial area of the second housing structure 120. In another embodiment, the sensor area 131*d* may be disposed to extend to the first housing structure 110 and the second housing structure 120. In an embodiment, the electronic device 100 may include components exposed from the front surface of the electronic device 100 through the sensor area 131*d* or at least one opening formed in the sensor area 131*d*, and various functions may be executed by these components. The components arranged in the sensor area 131*d* may include, for example, at least one of a front camera device, a proximity sensor, an illuminance sensor, an iris recognition sensor, an ultrasonic sensor, or an indicator. However, the components are not limited to this embodiment. The sensor area 131*d* may be omitted according to an embodiment. According to the embodiment, the components arranged in the sensor area 131*d* may be distributed over at least a partial area of the first housing structure 110 and/or the second housing structure 120.

In an embodiment, the first rear cover 140 may be disposed on the second surface 112 of the first housing structure 110 and have a substantially rectangular periphery. In an embodiment, the periphery of the first rear cover 140 may be at least partially surrounded by the first housing structure 110. Similarly, the second rear cover 150 may be disposed on the fourth surface 122 of the second housing structure 120, and the periphery of the second rear cover 150 may be at least partially surrounded by the second housing structure 120.

In the illustrated embodiment, the first rear cover 140 and the second rear cover 150 may have a substantially symmetrical shape with respect to the folding axis A. In another embodiment, the first rear cover 140 and the second rear cover 150 may be in various different shapes. In another embodiment, the first rear cover 140 may be integrally formed with the first housing structure 110, and the second rear cover 150 may be integrally formed with the second housing structure 120.

In an embodiment, a structure in which the first rear cover 140, the second rear cover 150, the first housing structure 110, and the second housing structure 120 are coupled with each other may provide a space in which various components (e.g., a printed circuit board (PCB), an antenna module, a sensor module, or a battery) may be arranged. In an embodiment, one or more components may be disposed or visually exposed on the rear surface of the electronic device 100. For example, one or more components or sensors may be visually exposed through a first rear area 141 of the first rear cover 140. In one or more embodiments, the sensors may include a proximity sensor, a rear camera device, and/or a flash. In another embodiment, at least a part of a sub-display 152 may be visually exposed through a second rear area 151 of the second rear cover 150.

The display 130 may be disposed in a space defined by the pair of housing structures 110 and 120. For example, the display 130 may be mounted in the recess (e.g., the recess 101 of FIG. 1) formed by the pair of housing structures 110 and 120, and occupy substantially most of the front surface of the electronic device 100. For example, the front surface of the electronic device 100 may include the display 130, and partial areas (e.g., peripheral areas) of the first and second housing structures 110 and 120 adjacent to the display 130. In an embodiment, the rear surface of the electronic device 100 may include the first rear cover 140, a partial area (e.g., a peripheral area) of the first housing structure 110 adjacent to the first rear cover 140, the second rear cover 150, and a partial area (e.g., a peripheral area) of the second housing structure 120 adjacent to the second rear cover 150.

In an embodiment, the display 130 may refer to a display which is at least partially deformable into a flat surface or a curved surface. In an embodiment, the display 130 may include a folding area 131*c*, a first area 131*a* disposed on one side of the folding area 131*c* (e.g., a right area of the folding area 131*c*), and a second area 131*b* disposed on the other side of the folding area 131*c* (e.g., a left area of the folding area 131*c*). For example, the first area 131*a* may be disposed on the first surface 111 of the first housing structure 110, and the second area 131*b* may be disposed on the third surface 121 of the second housing structure 120. For example, the display 130 may extend from the first surface 111 to the third surface 121 through the hinge structure 164 of FIG. 3, and at least an area corresponding to the hinge structure 164 (e.g., the folding area 131*c*) may be a flexible area deformable from the shape of a flat plate to the shape of a curved surface.

In an embodiment, the area division of the display 130 is exemplary, and the display 130 may be divided into a plurality of areas (e.g., two areas or four or more areas) according to its structure or function. For example, in the embodiment illustrated in FIG. 1, the folding area 131*c* may extend in a vertical direction (e.g., a Y axis of FIG. 3) parallel to the folding axis A, and the display 130 may be divided into areas with respect to the folding area 131*c* or the folding axis A, whereas in another embodiment, the display 130 may be divided into areas with respect to a different folding area (e.g., a folding area parallel to a horizontal axis (e.g., an X axis of FIG. 3) or a different folding axis (e.g., a folding axis parallel to the X axis of FIG. 3). The above-described area division of the display 130 is only a physical division by the pair of housing structures 110 and 120 and the hinge module (e.g., the hinge structure 164 of FIG. 3). The display 130 may display one full screen through substantially the pair of housing structures 110 and 120 and the hinge structure (e.g., the hinge structure 164 of FIG. 3).

According to an embodiment, the first area 131*a* and the second area 131*b* may have a symmetrical shape as a whole with respect to the folding area 131*c*. However, unlike the second area 131*b*, the first area 131*a* may include a notch area (e.g., a notch area 133 of FIG. 3) providing the sensor area 131*d*, and may have a shape symmetrical with that of the second area 131*b* in the remaining area. For example, the first area 131*a* and the second area 131*b* may include parts symmetrical to each other and parts asymmetrical to each other, in terms of shape.

Figure 3:
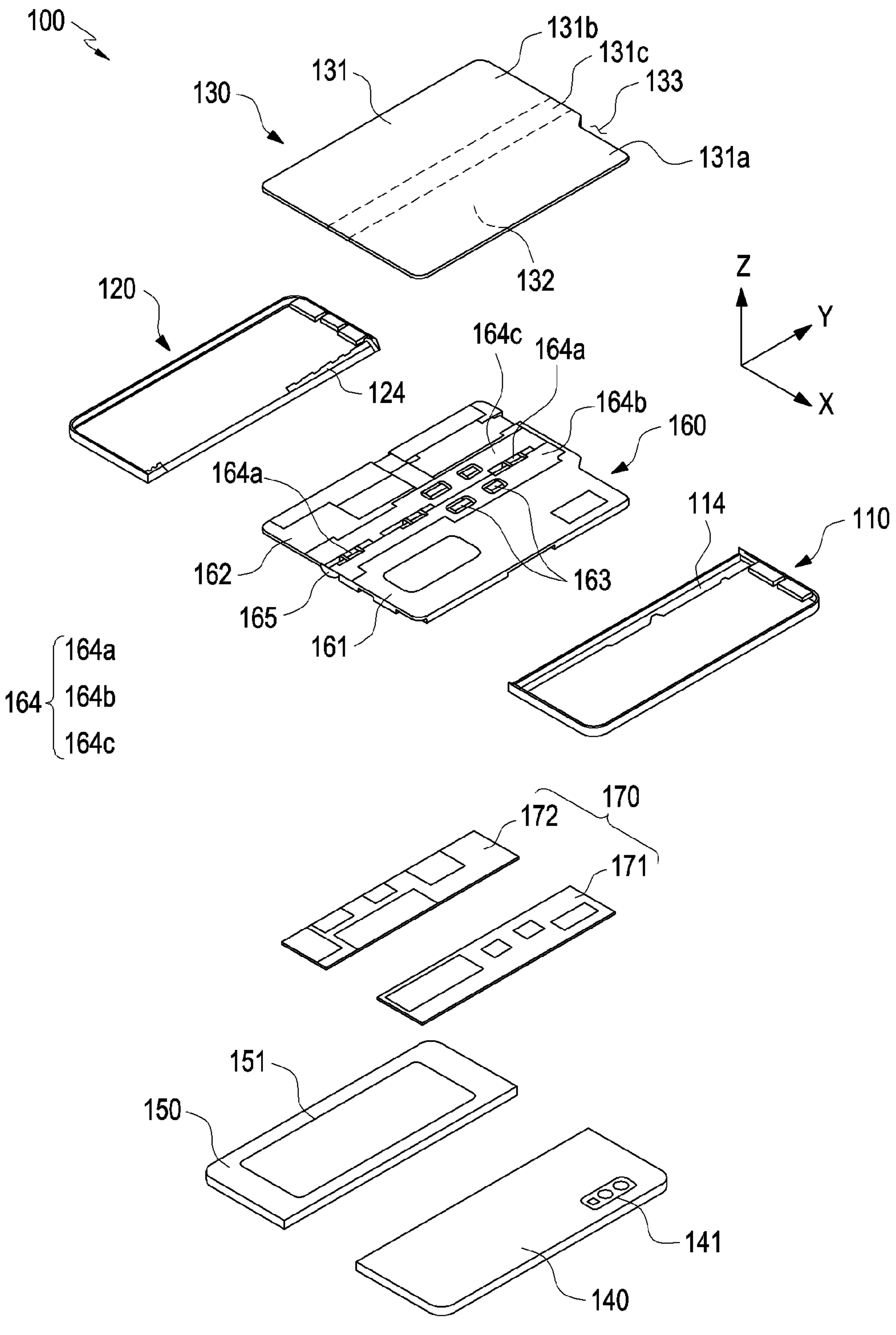
FIG. 3 is an exploded perspective view illustrating an electronic device according to one or more embodiments of the disclosure.

Referring further to FIG. 3, the hinge cover 165 may be disposed between the first housing structure 110 and the second housing structure 120 and configured to cover an internal component (e.g., the hinge structure 164 of FIG. 3). In an embodiment, the hinge cover 165 may be covered or exposed outward by parts of the first housing structure 110 and the second housing structure 120 according to an operating state (the unfolded state or the folded state) of the electronic device 100.

Now, a description will be given of the operations of the first housing structure 110 and the second housing structure 120 and each area of the display 130 according to the operating states (e.g., the unfolded state and the folded state) of the electronic device 100.

In an embodiment, when the electronic device 100 is in the unfolded state (e.g., the state of FIG. 1), the first housing structure 110 and the second housing structure 120 may be at an angle of 180 degrees, and the first area 131*a* and the second area 131*b* of the display 130 may be disposed to face the same direction, for example, to display screens in parallel directions. Further, the folding area 131*c* may form the same plane with the first area 131*a* and the second area 131*b*.

In an embodiment, when the electronic device 100 is in the folded state (e.g., the state of FIG. 2), the first housing structure 110 and the second housing structure 120 may be disposed to face each other. For example, when the electronic device 100 is in the folded state (e.g., the state of FIG. 2), the first area 131*a* and the second area 131*b* of the display 130 may be at a narrow angle (e.g., between 0 and 10 degrees) and face each other. When the electronic device 100 is in the folded state (e.g., the state of FIG. 2), at least a part of the folding area 131*c* may form a curved surface with a specific curvature.

In an embodiment, when the electronic device 100 is in the intermediate state, the first housing structure 110 and the second housing structure 120 may form a certain angle, for example, 90 degrees or 120 degrees. For example, in the intermediate state, the first area 131*a* and the second area 131*b* of the display 130 may form an angle larger than that in the folded state and smaller than that in the unfolded state. At least a part of the folding area 131*c* may have a curved surface with a predetermined curvature, which may be smaller than that in the folded state.

FIG. 3 is an exploded perspective view illustrating the electronic device 100 according to one or more embodiments of the disclosure.

Referring to FIG. 3, in an embodiment, the electronic device 100 may include the display 130, a support member assembly 160, at least one PCB 170, the first housing structure 110, the second housing structure 120, the first rear cover 140, and the second rear cover 150. Herein, the display 130 may be referred to as a display module or a display assembly.

The display 130 may include a display panel 131 (e.g., a flexible display panel) and at least one plate 132 or layer on which the display panel 131 is mounted. In an embodiment, the plate 132 may be disposed between the display panel 131 and the support member assembly 160. The display panel 131 may be disposed on at least a part of one surface (e.g., a surface in a Z-axis direction of FIG. 3) of the plate 132. The plate 132 may have a shape corresponding to the display panel 131. For example, a partial area of the plate 132 may be formed into a shape corresponding to the notch area 133 of the display panel 131.

The support member assembly 160 may include a first support member 161, a second support member 162, the hinge structure 164 disposed between the first support member 161 and the second support member 162, the hinge cover 165 which covers the hinge structure 164 when the hinge structure 164 is viewed from the outside, and a wiring member 163 (e.g., a flexible printed circuit board (PFBC)) crossing the first and second support members 161 and 162.

In an embodiment, the support member assembly 160 may be disposed between the plate 132 and the at least one PCB 170. For example, the first support member 161 may be disposed between the first area 131*a* of the display 130 and a first PCB 171. The second support member 162 may be disposed between the second area 131*b* of the display 130 and a second PCB 172.

In an embodiment, at least a part of the wiring member 163 and the hinge structure 164 may be disposed inside the support member assembly 160. The wiring member 163 may be disposed in a direction (e.g., an X-axis direction) crossing the first support member 161 and the second support member 162. The wiring member 163 may be disposed in the direction (e.g., the X-axis direction) perpendicular to the folding axis (e.g., the Y axis or the folding axis A of FIG. 1) of the folding area 131*c*.

According to one or more embodiments, the hinge structure 164 may include a hinge module 164*a*, a first hinge plate 164*b*, and/or a second hinge plate 164*c*. In a certain embodiment, the hinge module 164*a* may be interpreted as including the first hinge plate 164*b* and the second hinge plate 164*c*. In an embodiment, the first hinge plate 164*b* may be mounted inside the first housing structure 110, and the second hinge plate 164*c* may be mounted inside the second housing structure 120. In a certain embodiment, the first hinge plate 164*b* may be coupled with the first support member 161, and the second hinge plate 164*c* may be coupled with the second support member 162. In another embodiment, the first hinge plate 164*b* (or the second hinge plate 164*c*) may be coupled with another structure (e.g., a first rotation support surface 114 or a second rotation support surface 124) inside the first housing structure 110 (or the second housing structure 120). For example, the structure in which the first hinge plate 164*b* (or the second hinge plate 164*c*) is coupled inside the first housing structure 110 (or the second housing structure 120) may vary depending on embodiments. In another embodiment, the hinge module 164*a* may be coupled with the first hinge plate 164*b* and the second hinge plate 164*c* to rotatably couple the second hinge plate 164*c* to the first hinge plate 164*b*. For example, the folding axis (e.g., the folding axis A of FIG. 1) may be formed by the hinge module 164*a*, and the first housing structure 110 and the second housing structure 120 (or the first support member 161 and the second support member 162) may rotate substantially around the folding axis A with respect to each other.

The at least one PCB 170 may include the first PCB 171 disposed at the side of the first support member 161 and the second PCB disposed at the side of the second support member 162, as described before. The first PCB 171 and the second PCB 172 may be disposed inside a space formed by the support member assembly 160, the first housing structure 110, the second housing structure 120, the first rear cover 140, and the second rear cover 150. Components for executing various functions of the electronic device 100 may be arranged on the first PCB 171 and the second PCB 172.

In an embodiment, with the display 130 coupled with the support member assembly 160, the first housing structure 110 and the second housing structure 120 may be assembled to be coupled with both sides of the support member assembly 160. The first housing structure 110 and the second housing structure 120 may be slidably coupled with both sides of the support member assembly 160, for example, the first support member 161 and the second support member 162, respectively. The first support member 161 and the second support member 162 may be accommodated substantially in the first housing structure 110 and the second housing structure 120, and according to an embodiment, the first support member 161 and the second support member 162 may be interpreted as parts of the first housing structure 110 and the second housing structure 120.

In an embodiment, the first housing structure 110 may include the first rotation support surface 114, and the second housing structure 120 may include the second rotation support surface 124 corresponding to the first rotation support surface 114. The first rotation support surface 114 and the second rotation support surface 124 may include curved surfaces corresponding to a curved surface included in the hinge cover 165.

In an embodiment, when the electronic device 100 is in the unfolded state (e.g., the state of FIG. 1), the first rotation support surface 114 and the second rotation support surface 124 may cover the hinge cover 165 such that the hinge cover 165 may not be exposed or may be minimally exposed from the rear surface of the electronic device 100. In an embodiment, when the electronic device 100 is in the folded state (e.g., the state of FIG. 2), the first rotation support surface 114 and the second rotation support surface 124 may rotate along the curved surface included in the hinge cover 165 to maximize exposure of the hinge cover 165 from the rear surface of the electronic device 100.

In the above detailed description, ordinal numbers such as first and second in the first housing structure 110, the second housing structure 120, the first side member 113, and the second side member 123 are used simply to distinguish components from each other, and it should be noted that the ordinal numbers do not limit the disclosure. For example, although the sensor area 131*d* has been described as formed in the first housing structure 110 by way of example, the sensor area 131*d* may be formed in the second housing structure 120 or the first and second housing structures 110 and 120. In another embodiment, although it has been described that the first rear area 141 is disposed on the first rear cover 140 and the sub-display 152 is disposed on the second rear cover 150 by way of example, both the first rear area 141 for arranging sensors and so on therein and the sub-display 152 for outputting a screen may be disposed on either the first rear cover 140 or the second rear cover 150.

Figure 4:
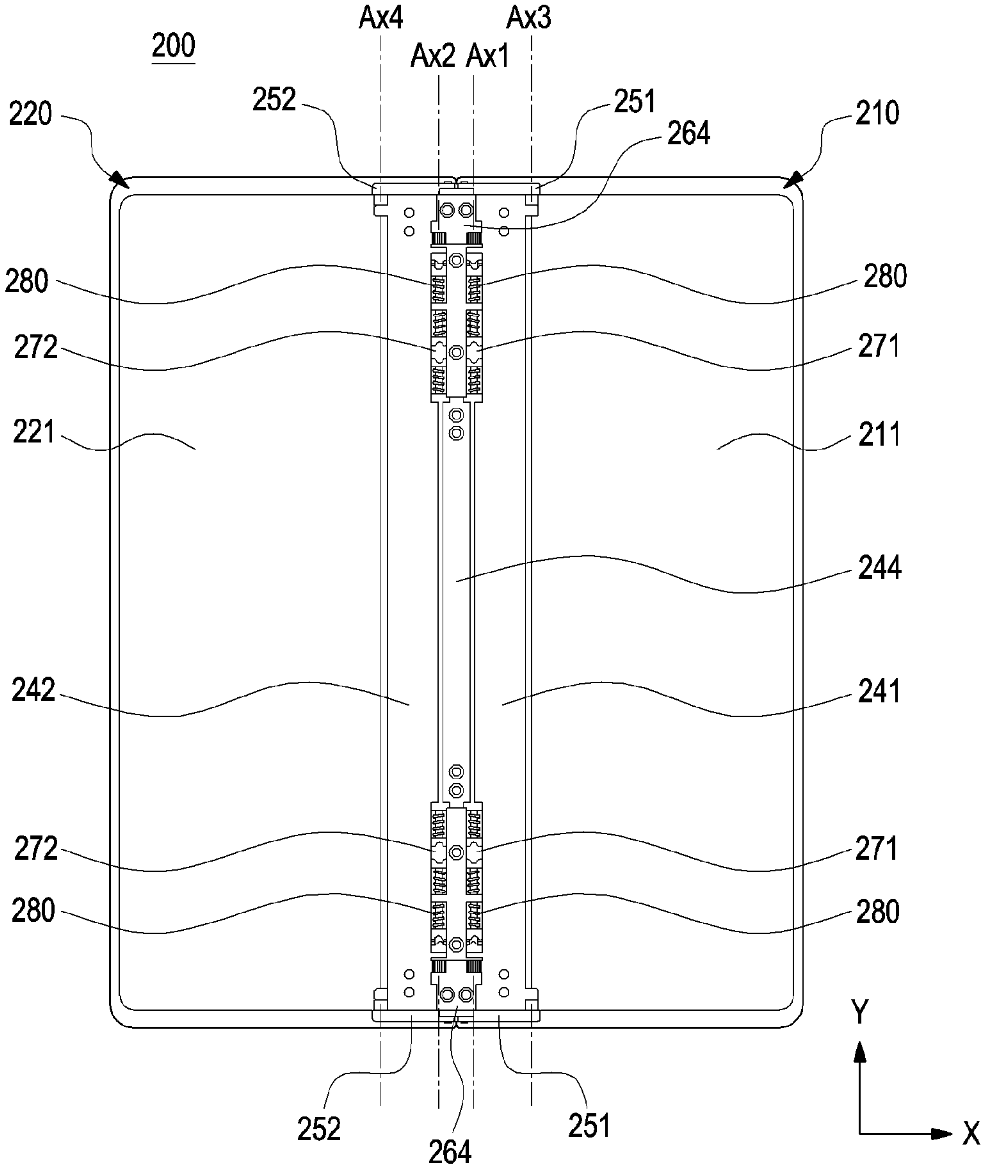
FIG. 4 is a front view illustrating a hinge module in an electronic device according to one or more embodiments of the disclosure.
Figure 5:
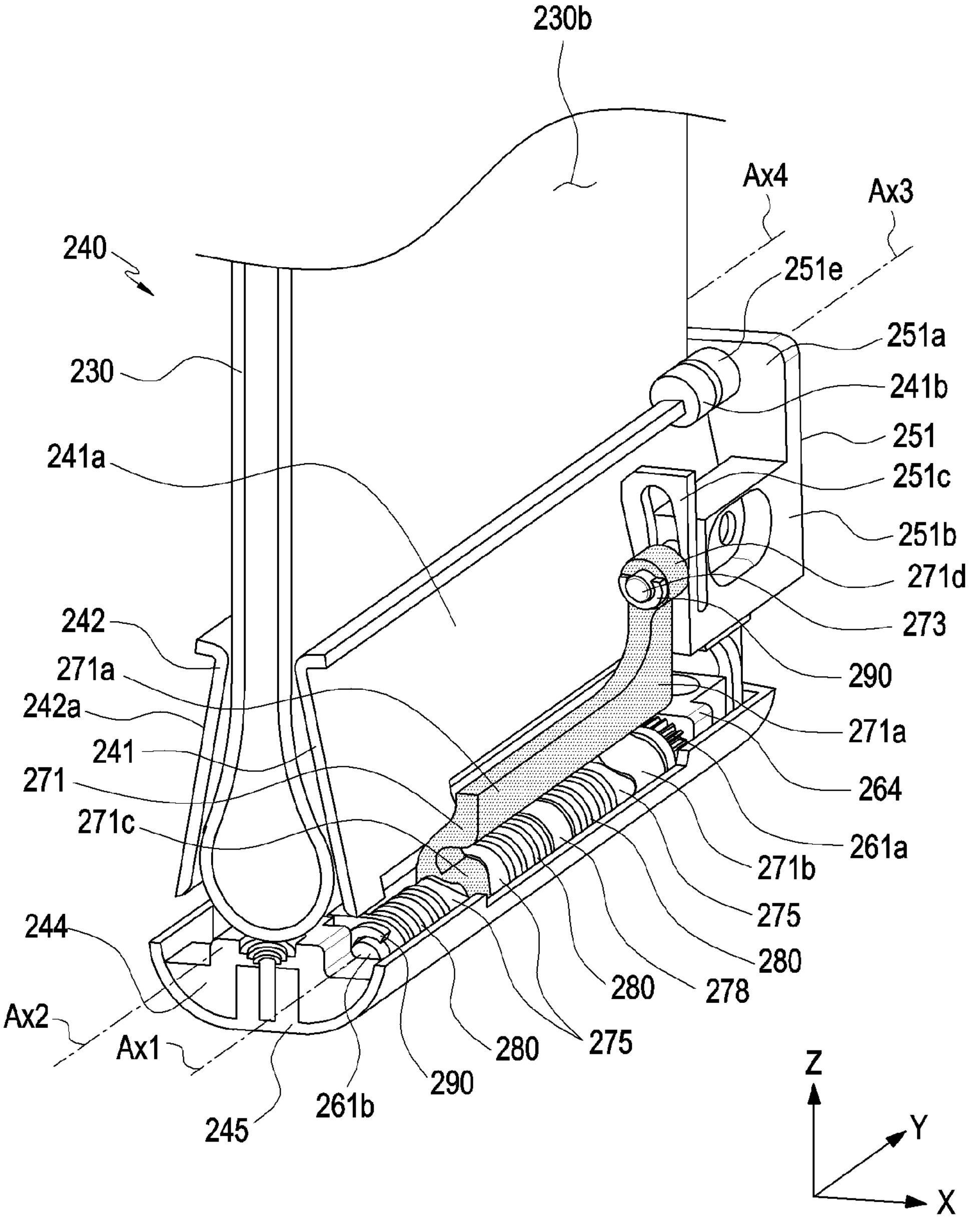
FIG. 5 is a perspective view illustrating a hinge module in an electronic device according to one or more embodiments of the disclosure.
Figure 6:
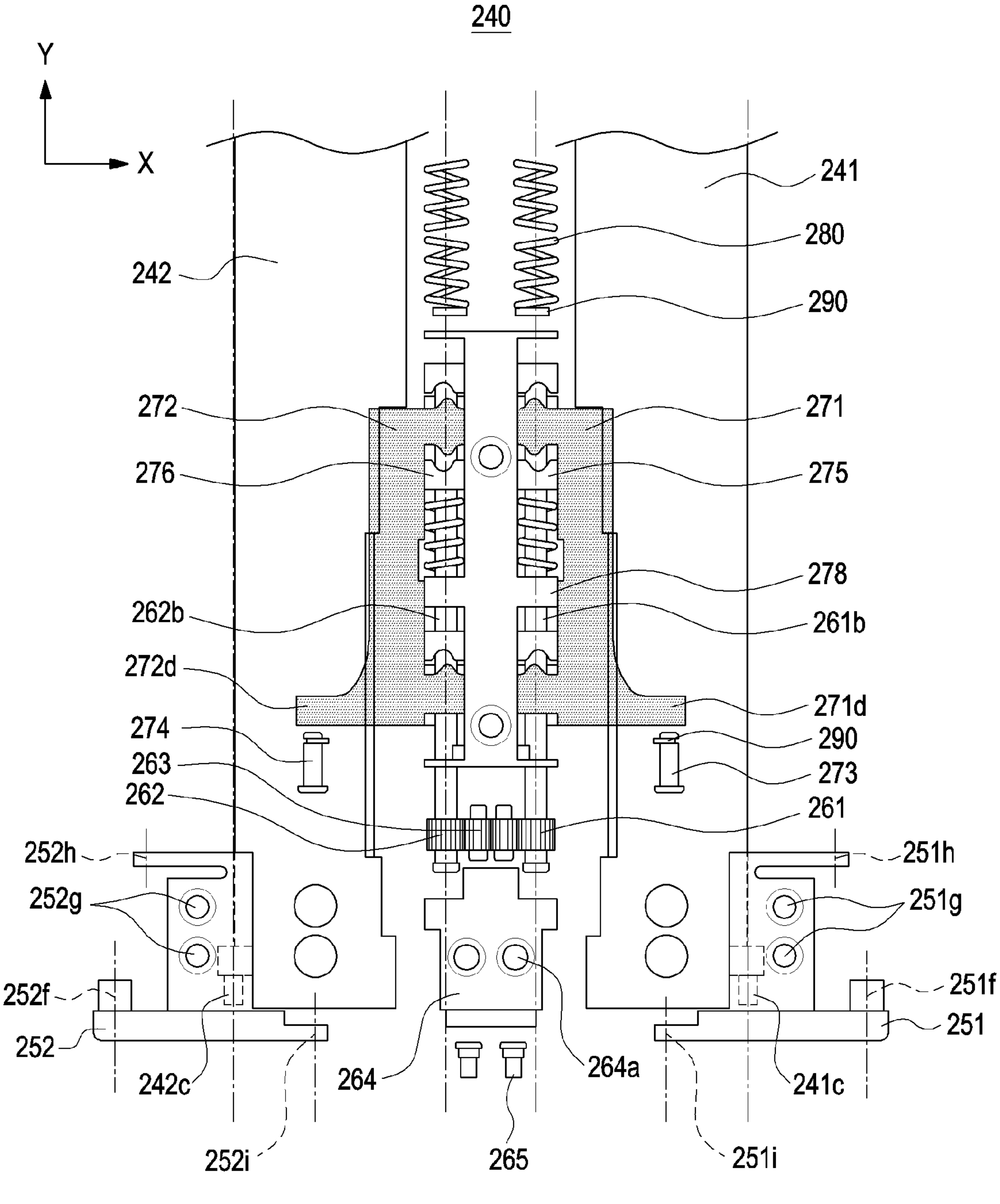
FIG. 6 is a diagram illustrating a state in which some of components included in a hinge module are separate from each other according to one or more embodiments of the disclosure.

FIG. 4 is a front view illustrating a hinge module 240 (e.g., the hinge structure 164 and/or the hinge module 164*a* of FIG. 3) in an electronic device 200 (e.g., the electronic device 100 of FIGS. 1 to 3) according to one or more embodiments of the disclosure. FIG. 5 is a perspective view illustrating the hinge module 240 in the electronic device 200 according to one or more embodiments of the disclosure. FIG. 6 is a diagram illustrating a state in which some of components included in the hinge module 240 are separate according to one or more embodiments of the disclosure. FIGS. 4 and 6 may illustrate the electronic device 200 in an unfolded state, and FIG. 5 may illustrate the electronic device 200 in a folded state.

Figure 7A:
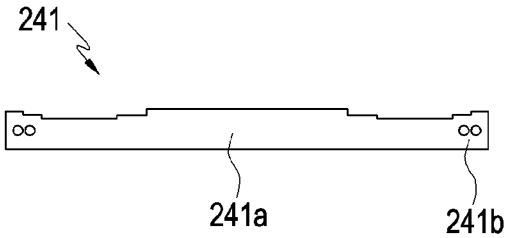
FIG. 7A is a diagram illustrating a hinge plate (e.g., a first hinge plate) according to an embodiment of the disclosure.
Figure 7B:
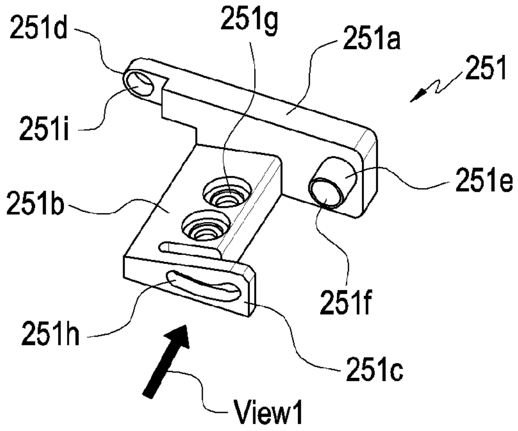
FIG. 7B is a diagram illustrating a rotation bracket (e.g., a first rotation bracket) according to an embodiment of the disclosure.
Figure 7C:
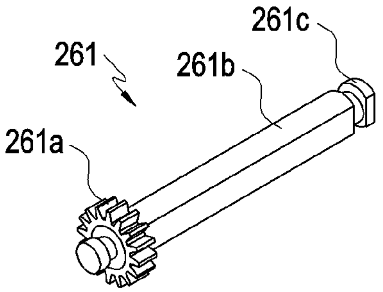
FIG. 7C is a diagram illustrating a gear (e.g., a first gear) according to an embodiment of the disclosure.
Figure 7D:
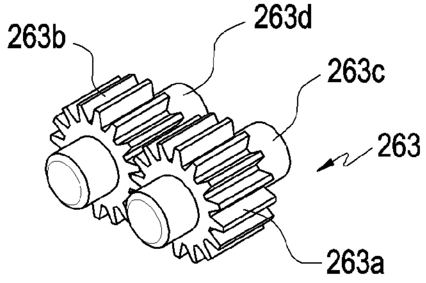
FIG. 7D is a diagram illustrating an interlocking gear according to an embodiment of the disclosure.
Figure 7E:
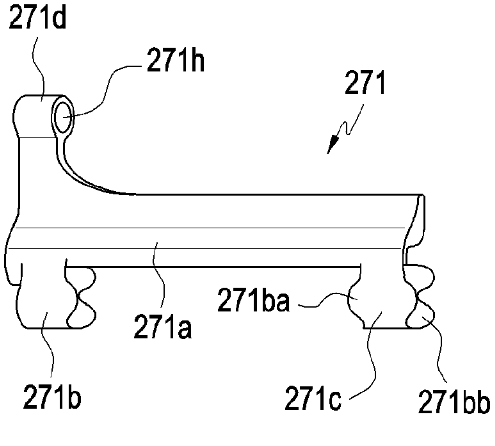
FIG. 7E is a diagram illustrating a hinge arm (e.g., a first hinge arm) according to an embodiment of the disclosure.
Figure 7F:
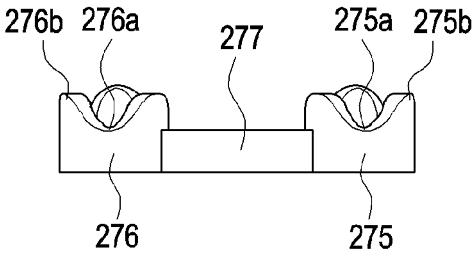
FIG. 7F is a diagram illustrating a cam structure assembly according to an embodiment of the disclosure.

FIG. 7A is a diagram illustrating a hinge plate (e.g., a first hinge plate) according to an embodiment of the disclosure. FIG. 7B is a diagram illustrating a rotation bracket (e.g., a first rotation bracket) according to an embodiment of the disclosure. FIG. 7C is a diagram illustrating a gear (e.g., a first gear) according to an embodiment of the disclosure. FIG. 7D is a diagram illustrating an interlocking gear according to an embodiment of the disclosure. FIG. 7E is a diagram illustrating a hinge arm (e.g., a first hinge arm) according to an embodiment of the disclosure. FIG. 7F is a diagram illustrating a cam structure assembly according to an embodiment of the disclosure.

Referring to FIGS. 4 and 5, the electronic device 200 may include a first housing 210 (e.g., the first housing structure 110 of FIGS. 1 to 3), a second housing 220 (e.g., the second housing structure 120 of FIGS. 1 to 3), a display 230 (e.g., the display 130 of FIG. 1 and/or FIG. 3), the hinge module 240, and/or a hinge cover 245 (e.g., the hinge cover 165 of FIG. 2 and/or FIG. 3). The hinge cover 245 may be substantially concealed by the first housing 210 and the second housing 220 in the unfolded state of the electronic device 200, and at least partially exposed to an external space from between the first housing 210 and the second housing 220 in the folded state of the electronic device 200. The hinge module 240 may be disposed or mounted inside (e.g., on an inner surface) of the hinge cover 245 and couple the first housing 201 and the second housing 220 to each other. In an embodiment, the hinge module 240 may provide the folding axis A of FIG. 1, and according to an embodiment, provide a rotation axis Ax1 serving as the center of rotation of the first housing 210 and a rotation axis Ax2 serving as the center of rotation of the second housing 220. The first rotation axis Ax1 and the second rotation axis Ax2 may be formed or disposed at positions spaced apart from each other by a predetermined distance. A direction in which the first rotation axis Ax1 and/or the second rotation axis Ax2 extends may be defined as a longitudinal direction (e.g., the Y-axis direction) of the electronic device 200.

According to one or more embodiments, the hinge module 240 and/or the hinge cover 245 may be located to substantially correspond to a folding area (e.g., the folding area 131*c* of FIG. 1) of the display 230, and the first housing 210 and the second housing 220 may be coupled with the hinge module 240 and rotate with respect to the hinge module 240. The first housing 210 and the second housing 220 may rotate between a position at which they face each other (e.g., the folded state in FIG. 2) and a position at which they are unfolded at a specified angle with respect to each other (e.g., the unfolded state in FIG. 1). The first housing 210 may rotate around the first rotation axis Ax1, and the second housing 220 may rotate around the second rotation axis Ax2. In an embodiment, "a position at which they are unfolded at a specified angle" may include a position at which the first housing 210 and the second housing 220 are unfolded at an angle of 180 degrees with respect to each other, and when one of the first housing 210 and the second housing 220 rotates, the hinge module 240 may rotate the other of the first housing 210 and the second housing 220. For example, when the first housing 210 rotates in a direction away from the second housing 220, the hinge module 240 may rotate the second housing 220 in a direction away from the first housing 210. In a certain embodiment, when the first housing 210 and the second housing 220 rotate from the position at which they face each other to the position at which they form an angle of 180 degrees with respect to each other, the first housing 210 may rotate in an angular range of 90 degrees with respect to the hinge module 240, and the second housing 220 may also rotate in an angular range of 90 degrees with respect to the hinge module 240.

Referring to FIGS. 4 to 7F, the hinge module 240 according to various embodiments of the disclosure may include a first hinge plate 241 (e.g., the first hinge plate 164*b* of FIG. 3), a second hinge plate 242 (e.g., the second hinge plate 164*a* of FIG. 3), a first rotation bracket 251, a second rotation bracket 252, a first gear 261, a second gear 262, an interlocking gear 263, a gear bracket 264, a first hinge arm 271, a second hinge arm 272, a first cam structure 275, a second cam structure 276, and/or a stopper 278.

According to one or more embodiments, the first hinge plate 241 and the second hinge plate 242 may have substantially the same structure, and thus components provided in the hinge plates 241*a* and 242*a* may also have the same structures. Therefore, the components provided in the hinge plates 241*a* and 242*a* may be described regardless of whether they are included in the first hinge plate 241 or the second hinge plate 242. In addition, the first rotation bracket 251 and the second rotation bracket 252, the first gear 261 and the second gear 262, the first hinge arm 271 and the second hinge arm 272, and/or the first cam structure 273 and the second cam structure 274 may also have substantially the same structure. Sub-components of the two substantially identical components may be described without distinction between a 'first' component from a 'second' component. In describing the sub-components of the two substantially identical components below, for example, a description of the sub-components included in the 'first component' is applicable equally to the sub-components included in the 'second component'. Therefore, a description of the sub-components included in the 'second component' may be omitted as far as it is redundant to the description of the subcomponents included in the 'first component', and the description of the subcomponents included in the 'first component' may be adaptively applied to the subcomponents included in the 'second component'.

In the hinge module 240 according to one or more embodiments of the disclosure, each of a plurality of components for driving the hinge module 240 may be provided in a pairwise manner and disposed to be latitudinally symmetrical with respect to a folding axis (e.g., the folding axis A in FIG. 1). For example, the hinge module 240 may include the first hinge plate 241 and the second hinge plate 242 as components for driving, and the first hinge plate 241 and the second hinge plate 242 may be provided latitudinally symmetrical with respect to the folding axis (e.g., the folding axis A in FIG. 1) as substantially the same components. Accordingly, a description of the first hinge plate 241 may be applied to the second hinge plate 242 symmetrical with respect to the folding axis (e.g., the folding axis A in FIG. 1). A description of components arranged in latitudinal symmetry with respect to the folding axis (e.g., the folding axis A in FIG. 1) is also applicable to a description of other components included in the hinge module 240 (e.g., the first hinge bracket 251 and the second hinge bracket 252 or the first hinge arm 271 and the second hinge arm 272). In addition, the hinge module 240 according to one or more embodiments of the disclosure may be provided as a hinge module located on one side (e.g., a top end) of the electronic device 200 and a hinge module located on the other side (e.g., a bottom end) of the electronic device 200, that is, as a pair of hinge modules, and the pair of hinge modules may be disposed in longitudinal symmetry at the top and bottom ends of the electronic device 200 with the support member 244 as the center. In an example, the hinge module 240 of FIG. 5 may be the hinge module located on the one side (e.g., the top end) of the electronic device 200, and the hinge module 240 of FIG. 6 may be the hinge module located on the other side (e.g., the bottom end) of the electronic device 200. The pair of hinge modules disposed on the top and bottom ends of the electronic device 200 may have the same configuration, and thus, a description of one hinge module may be applied to a description of the other hinge module.

Referring to FIGS. 6 and 7A, according to one or more embodiments, the first hinge plate 241 and the second hinge plate 242 (e.g., the first hinge plate 164*b* and the second hinge plate 164*a* of FIG. 3) may be rotatably coupled with the first rotation bracket 251 and the second rotation bracket 252, respectively. A hinge plate (e.g., the first hinge plate 241) may be configured as a substantially flat portion (e.g., a flat portion 242*a*), and according to an embodiment, at least a part of the hinge plate may be formed to have a curved shape with a predetermined curvature. For example, at least a part of an edge of the flat portion 242*a* in the first hinge plate 241 may be bent in one direction (e.g., in the x-axis direction in FIG. 5). This shape may be equally applied to a flat portion 242*a* of the second hinge plate 242. That is, at least a part of an edge of the flat portion 242*a* of the second hinge plate 242 may be bent in one direction (e.g., in a direction opposite to the x axis in FIG. 5). According to an embodiment, one side of the hinge plate (e.g., the first hinge plate 241) may be rotatably coupled with the rotation bracket (e.g., the first rotation bracket 251). Herein, “one side” of the hinge plate (e.g., the first hinge plate 241) may be a fastening portion 241*b* illustrated in FIG. 5. For example, the first hinge plate 241 may be formed to rotate around a third rotation axis Ax3, while being connected to the first rotation bracket 251 through the fastening portion 241*b*. In another example, as illustrated in FIGS. 5 and 6, a protruding pin 241*c* may be formed on the fastening portion 241*b* and coupled with a fastening hole 251*f* of the first rotation bracket 251. Similarly, the second hinge plate 242 may be formed to rotate around a fourth rotation axis Ax4, while being connected to the second rotation bracket 252 through a fastening portion. As illustrated in FIGS. 5 and 6, a protruding pin 242*c* may be formed on the fastening portion of the second hinge plate 242 and coupled with a fastening hole 252*f* of the second rotation bracket 252.

Referring to FIGS. 6 and 7B, a rotation bracket (e.g., the first rotation bracket 251) may include a base 251*a* and a plurality of arms. The base 251*a* may be a part which has a predetermined partial plate shape in the rotation bracket structure, and which according to an embodiment, is exposed to the outside of the electronic device 200. According to an embodiment, the base 251*a* may be formed to face a direction perpendicular to the hinge plate (e.g., the first hinge plate 241). According to an embodiment, a fastening member 251*e* connected to the fastening portion 241*b* of the hinge plate (e.g., the first hinge plate 241) may be formed on one surface of the base 251*a*. For example, the fastening member 251*e* having a fastening hole (e.g., a first hole 2510, into which the protruding pin-shaped fastening portion 241*b* of the hinge plate (e.g., the first hinge plate 241) is press-fitted, formed thereon may be formed to protrude in the Y direction on the one surface of the base 251*a*. For example, as the protruding-pin shape of the fastening part 241*b* is accommodated in the fastening hole (e.g., the first hole 2510 of the fastening member 251*e*, the hinge plate (e.g., the first hinge plate 241) may be rotatably coupled with the rotation bracket (e.g., the first rotation bracket 251). According to an embodiment, the plurality of arms may be integrally connected to the base 251*a*. For example, the plurality of arms may include a first arm 251*b* extending in a direction perpendicular to the base 251*a*, and a second arm 251*c* extending from an end of the first arm 251*b* in a direction parallel to the base 251*a*. According to an embodiment, the first arm 251*b* may protrude from one surface of the base 251*a* in the longitudinal direction of the electronic device, and have at least one surface (e.g., a surface facing the hinge plate) inclined. In addition, according to an embodiment, a second hole 251*g* with which a member (e.g., a screw) is fastened to fix the rotation bracket (e.g., the first rotation bracket 251) to at least one plate (e.g., the at least one plate 132 of FIG. 3) in the housing of the electronic device 200 may be formed on the first arm 251*b*. According to one or more embodiments, a pin hole (e.g., a third hole 251*h*) for guiding the sliding movement of a pin member (e.g., the second pin member 273) may be formed on the second arm 251*c*.

According to one or more embodiments, the plurality of arms may further include a third arm 251*d* which extends from the base 251*a* in a direction parallel to the base 251*a* and has a fastening hole (e.g., a fourth hole 251*i*) formed thereon, with which a first pin member 265 is fastened. According to another embodiment, the second arm 251*c* may be integrated into the first arm 251*b* under the condition that a pin hole (e.g., the third hole 251*h*) for guiding the sliding movement of a pin member (e.g., a second pin member 273) is equally formed on the second arm 251*c*.

The hinge plates 241 and 242 may rotatably coupled with the rotation brackets 251 and 252, respectively, and rotate around the third rotation axis Ax3 and the fourth rotation axis Ax4. For reference, the third rotation axis Ax3 and the fourth rotation axis Ax4 may be different from the first rotation axis Ax1 and the second rotation axis Ax2. The third rotation axis Ax3 may be an axis spaced apart from the first rotation axis Ax1 by a specific distance and directed in a direction parallel to the first rotation axis Ax1, and the fourth rotation axis Ax4 may be an axis spaced apart from the second rotation axis Ax2 by a specific distance and directed in a direction parallel to the second rotation axis Ax2.

Referring to FIGS. 6, 7C and 7D, according to one or more embodiments, the hinge module 240 may include a gear member including the first gear 261, the second gear 262, the interlocking gear 263, and/or the gear bracket 264. For example, the first gear 261 may include a gear shaft 261*b* rotatable around the first rotation axis Ax1, and a teeth portion 261*a* provided at one side of the gear shaft 261*b* to mesh with a teeth portion of the interlocking gear 263. Further, the second gear 262 may include a gear shaft 262*b* rotatable around the second rotation axis Ax2, and a teeth portion provided at one side of the gear shaft 262*b* to mesh with a teeth portion of the interlocking gear 263.

According to one or more embodiments, the gear member may include the interlocking gear 263 disposed between the first gear 261 and the second gear 262. The interlocking gear 263 may include a plurality of (e.g., two) idle gears. The plurality of idle gears may include shafts 263*c* and 263*d* and teeth portions 263*a* and 263*b* meshed with their adjacent gears while rotating around the shafts. The teeth portions 263*a* and 263*b* of the plurality of idle gears may be connected to the teeth portion 261*a* of the first gear 261 and the teeth portion of the second gear 262. According to an embodiment, rotation of the first gear 261 may be transmitted to the second gear 262 through the interlocking gear 263, and rotation of the second gear 262 may be transmitted to the first gear 261 through the interlocking gear 263.

According to one or more embodiments, the gear member may further include the gear bracket 264 to position-fixing the first gear 261, the second gear 262, and/or the interlocking gear 263. The gear bracket 264 may be coupled with the first rotation bracket 251 and the second rotation bracket 252. Unlike the first rotation bracket 251 and the second rotation bracket 252, the gear bracket 264 has a fixed relative position, and thus may be referred to as a 'fixing bracket'. According to an embodiment, the gear bracket 264 may be coupled with the first rotation bracket 251 and the second rotation bracket 252 by the first pin member 265 (or rivet), which will be described later. For example, a groove corresponding to the first pin member 265 may be formed on one surface of the gear bracket 264, and the third arm 251*d* of the first rotation bracket 251 may be aligned with the groove. The first pin member 265 may then be fixedly press-fitted into the groove and the third arm 251*d*. According to an embodiment, a fastening hole 264*a* with which a member (e.g., a screw) is to be fastened may be formed on one surface of the gear bracket 264 to fix the gear bracket to at least one plate (e.g., the at least one plate 132 of FIG. 3) inside the housing of the electronic device 200.

Referring to FIGS. 6, 7C and 7E, according to one or more embodiments, the first hinge arm 271 and the second hinge arm 272 may be configured to be fixed to the first shaft 261*b* of the first gear 261 and the second shaft 262*b* of the second gear 262, respectively, and rotate together with the first shaft 261*b* and the second shaft 262*b*. According to an embodiment, ends of the first shaft 261*b* and the second shaft 262*b* (e.g., an end 261*c* of the first shaft 261*b* in FIG. 7B) may be formed in an asymmetric cross-sectional structure (e.g., a D-cut cross-sectional structure), and press-fitted into the first hinge arm 271 and the second hinge arm 272, respectively. Accordingly, the first hinge arm 271 may rotate together with the first shaft 261*b* around the first rotation axis Ax1, and the second hinge arm 272 may rotate together with the second shaft 262*b* around the second rotation axis Ax2. A hinge arm (e.g., the first hinge arm 271) may include a body 271*a* elongated in the longitudinal direction of the electronic device, and at least one link arm 271*b* and 271*c* protruding from the body 271*a* in a direction perpendicular to the longitudinal direction of the body and having a cavity formed thereon to allow the shaft (e.g., the first shaft 261*b*) to be inserted therein. In addition, the hinge arm (e.g., the first hinge arm 271) may further include a guide arm (e.g., a first guide arm 271*d*) interlocking with the rotation bracket (e.g., the first rotation bracket 251). A hollow hole 271*h* may be formed on the guide arm 271*d*, and the second pin member 273 may be coupled with the hollow hole 271*h*. For example, the second pin member 273 may be press-fitted into the hollow hole 271*h*.

According to one or more embodiments, the hinge arm (e.g., the first hinge arm 271) may be connected to the second pin member 273. According to an embodiment, the hinge arm (e.g., the first hinge arm 271) may be connected to the rotation bracket (e.g., the first rotation bracket 251) using the second pin member 273. For example, the second pin member 273 connected to the first hinge arm 271 may be accommodated in the pin hole formed on the second arm 251*c* of the first rotation bracket 251. According to an embodiment, when the first hinge arm 271 moves, the second pin member 273 may move in the pin hole formed on the second arm 251*c* of the first rotation bracket 251. In addition, when a relative position of the second pin member 273 does not change any more in the pin hole even though force is applied to move the first hinge arm 271 in one direction, the first hinge arm 271 may rotate, and the first rotation bracket 251 may also rotate along with the first hinge arm 271.

Referring to FIGS. 6 and 7F, according to one or more embodiments, the hinge module 240 may include at least one cam structure. According to an embodiment, the hinge module 240 may include the first cam structure 275 corresponding to the link arm 271*b* or 271*c* of the first hinge arm 271 and the second cam structure 276 corresponding to a link arm of the second hinge arm 272. According to an embodiment, the cam structure may be formed as one cam structure assembly through a connecting cam 277 connecting the first cam structure 275 and the second cam structure 276 to each other. According to an embodiment, the cam structure assembly may be used together with at least one elastic member 280. As the cam structure assembly is used together with the at least one elastic member 280, the cam structure assembly may provide pressure or elastic force to the first hinge arm 271 and the second hinge arm 272. According to an embodiment, the cam structure (e.g., the first cam structure 275) may face the link arm 271*b* or 271*c* of the hinge arm (e.g., the first hinge arm 271). For example, according to one or more embodiments, the cam structure (e.g., the first cam structure 275) may include a first valley portion 275*a* and a first mountain portion 275*b* formed on a surface facing the link arm 271*b* or 271*c* of the hinge arm (e.g., the first hinge arm 271). A second mountain portion 271*bb* in a shape corresponding to the first valley portion 275*a* of the cam structure (e.g., the first cam structure 275) and a second valley portion 271*ba* in a shape corresponding to the first mountain portion 275*b* of the cam structure (e.g., the first cam structure 275) may be formed on a link arm (e.g., 271*c*) of the hinge arm (e.g., the first hinge arm 271). The cam structure (e.g., the first cam structure 275) and the link arms 271*b* and 271*c* may provide frictional force or elastic force in a direction in which the electronic device is opened or closed or may not provide the frictional force or elastic force in a certain section, according to rotation of the housing (e.g., the first housing) in an axial direction (e.g., around the first rotation axis Ax1), thereby constantly maintaining an angle between the first housing and the second housing.

According to one or more embodiments, the hinge module 240 may further include the stopper 278. The stopper 278 may be configured to be elongated on the whole in a longitudinal direction of the hinge arm (e.g., the first hinge arm 271), and have a protrusion formed in a latitudinal direction of the hinge arm (e.g., the first hinge arm 271). According to one or more embodiments of the disclosure, the protrusion of the stopper 278 may serve to limit linear movement of at least a part of the hinge arm (e.g., the first hinge arm 271), the cam structure (e.g., the first cam structure 275), and/or the elastic member 280.

Referring back to FIG. 6, the hinge module 240 and/or the electronic device 200 including the hinge module 240 may include a plurality of fastening members 290. The plurality of fastening members 290 may fasten pin members or fastening holes such that they do not deviate from each other. The fastening member(s) may include, for example, a C-ring or an E-ring.

Although not specifically mentioned in the above-described embodiment, the hinge module 240 and/or the electronic device 200 including the hinge module 240 may further include at least one support member 244. The support member 244 may be, for example, a bar-type support member, be disposed to correspond to an area where the hinge module 240 is disposed, and connect the hinge module located on one side (e.g., top end) of the electronic device 200 to the hinge module located on the other side (e.g., bottom) of the electronic device 200. For example, the support member 244 may be disposed to support the folding area (e.g., the folding area 131*c* of FIG. 1) of the flexible display 230. In another embodiment, the support member 244 may be disposed parallel to the longitudinal direction of the electronic device 200, for example, the first rotation axis Ax1 and/or the second rotation axis Ax2. For example, when the electronic device 200 is folded or unfolded, the support member 244 may be deformed to correspond to the folding area (e.g., the folding area 131*c* of FIG. 1) and support the folding area (e.g., the folding area 131*c* of FIG. 1). When an external object or a user contacts the folding area (e.g., the folding area 131*c* of FIG. 1) in the unfolded state of the electronic device 200, the support member 244 may suppress deformation of the folding area (e.g., the folding area 131*c* of FIG. 1) by supporting the folding area (e.g., the folding area 131*c* of FIG. 1).

Behaviors of the flexible display 230 and the hinge plates 241 and 242 in the unfolded or folded state of the electronic device may be described through the embodiments illustrated in FIGS. 8A to 12.

Figure 8A:
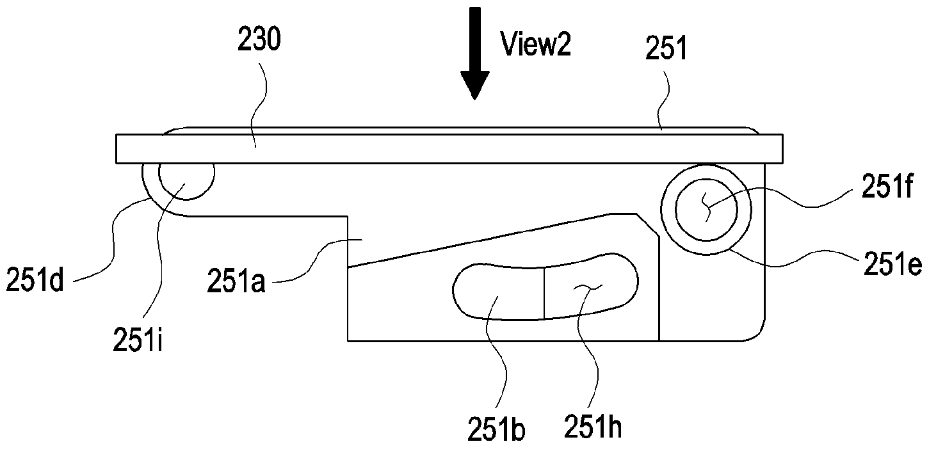
FIG. 8A is a cross-sectional view illustrating a positional relationship between a flexible display and a rotation bracket in an electronic device according to one or more embodiments.
Figure 8B:
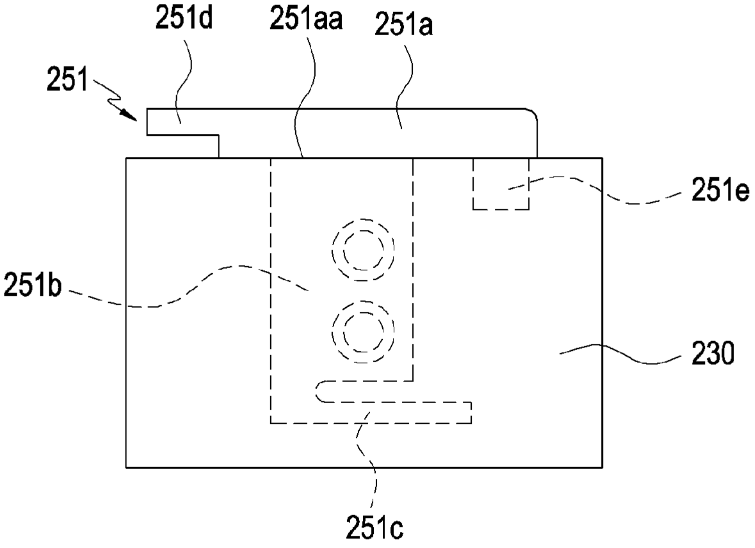
FIG. 8B is a front view illustrating a positional relationship between a flexible display and a rotation bracket in an electronic device according to one or more embodiments.

FIG. 8A is a cross-sectional view illustrating a positional relationship between the flexible display 230 and a rotation bracket (e.g., the first rotation bracket 251) in the electronic device according to one or more embodiments. FIG. 8B is a front view illustrating the positional relationship between the flexible display 230 and the rotation bracket (e.g., the first rotation bracket 251) in the electronic device according to one or more embodiments. FIG. 8A may illustrate a cross-section of the rotation bracket (e.g., the first rotation bracket 251), when viewed in an arrowed direction, View 1 illustrated in FIG. 7B. In addition, FIG. 8B may be a view of the embodiment of FIG. 8A, when viewed in an arrowed direction, View 2 illustrated in FIG. 8A.

According to one or more embodiments of the disclosure, the hinge module 240 and/or the electronic device 200 including the same may provide the third rotation axis (e.g., Ax3 in FIG. 4) formed at a different position from those of the first rotation axis (e.g., Ax1 in FIG. 4) and the second rotation axis (e.g., Ax2 in FIG. 4). According to an embodiment, the third rotation axis (e.g., Ax3 in FIG. 4) may be formed over the first hole 251*f* of the fastening member 251*e* formed on one side of the base 251*a* of the rotation bracket (e.g., the first rotation bracket 251). Referring to FIGS. 8A and 8B, in a state in which the flexible display 230 is formed to be at least partially surrounded by one surface 251*aa* of the base 251*a*, the position of the first hole 251*f* over which the third rotation axis (e.g., Ax3 in FIG. 4) is formed may be fairly close to the flexible display 230 and reside inside the housing rather than on the rear surface (e.g., a rear surface 230*b* in FIG. 5) of the flexible display 230.

Figure 9A:
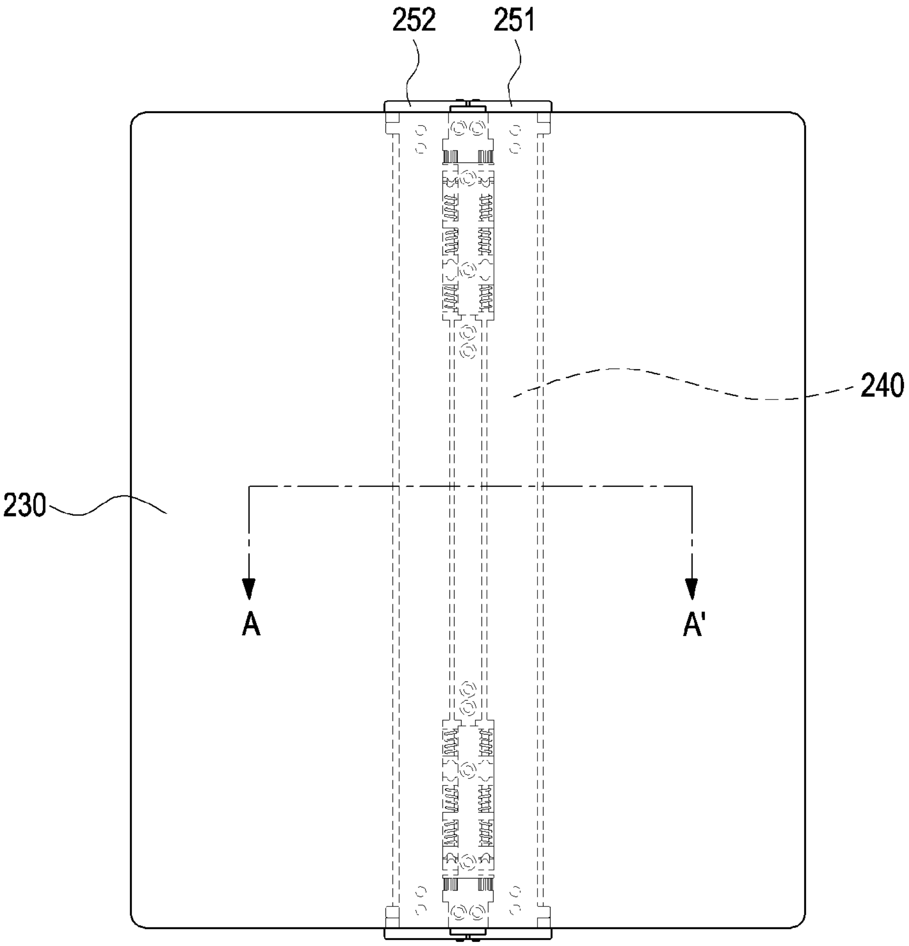
FIG. 9A is a front view illustrating a flexible display and a hinge module according to one or more embodiments of the disclosure.
Figure 9B:
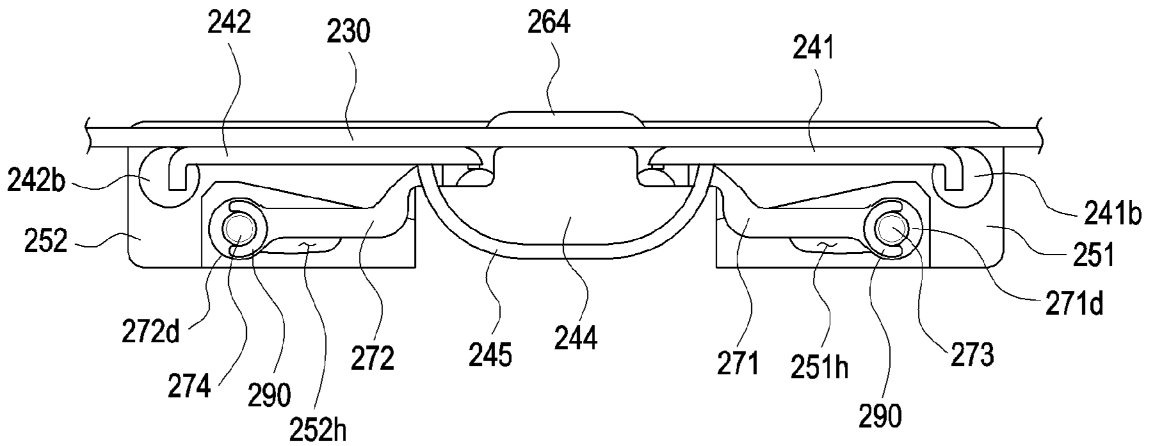
FIG. 9B is a cross-sectional view illustrating a flexible display and a hinge module in an unfolded state of an electronic device according to one or more embodiments of the disclosure.
Figure 9C:
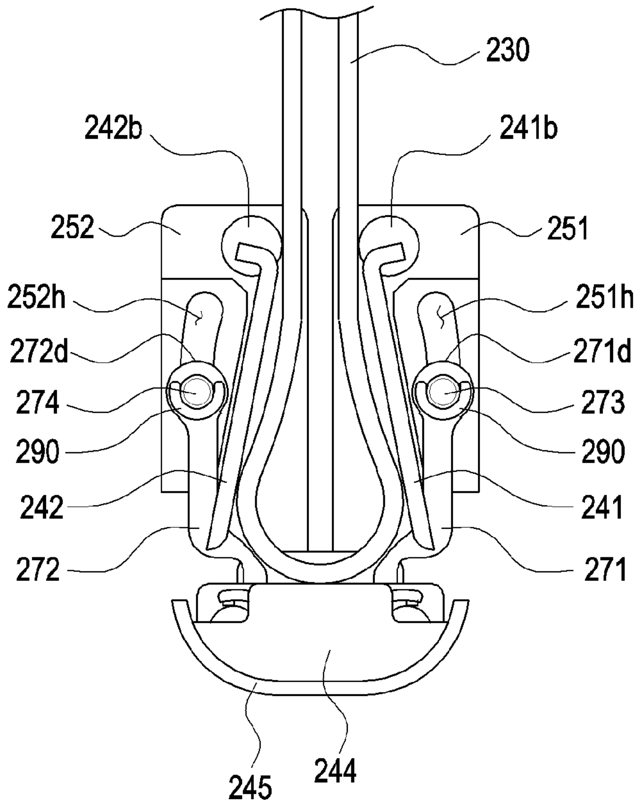
FIG. 9C is a cross-sectional view illustrating a flexible display and a hinge module in a folded state of an electronic device according to one or more embodiments of the disclosure.

FIG. 9A is a front view illustrating the flexible display 230 and the hinge module 240 according to one or more embodiments of the disclosure. FIG. 9B is a cross-sectional view illustrating the flexible display 230 and the hinge module 240 in the unfolded state of the electronic device according to one or more embodiments of the disclosure. FIG. 9C is a cross-sectional view illustrating the flexible display 230 and the hinge module 240 in the folded state of the electronic device according to one or more embodiments of the disclosure.

Referring to FIG. 9A, the flexible display 230 may be formed such that the folding area (e.g., the folding area 131*c* of FIG. 1) may be supported by the hinge module 240, and at least a part of the folding area (e.g., the folding area 131*c* of FIG. 1) may be formed to be surrounded by at least some components (e.g., the first rotation bracket 251 and the second rotation bracket 252) of the hinge module 240.

Referring to FIGS. 8A to 9C, in the unfolded state of the electronic device, the hinge plates 241 and 242 may be located on the rear surface of the flexible display 230 and support the flexible display 230. The fastening portions 241*b* and 242*b* of the hinge plates 241 and 242 may be fastened with the fastening members 251*e* and 252*e* of the rotation brackets 251 and 252, and rotate around the third and fourth rotation axes (e.g., Ax3 and Ax4 in FIG. 4), respectively.

According to an embodiment, the hinge arms 271 and 272 may slide with respect to the rotation brackets 251 and 252. According to an embodiment, the second pin members 273 and 274 connected to the hinge arms 271 and 272 may slide approximately in the latitudinal direction of the electronic device within the pin holes (e.g., third holes 251*h* and 252*h*) of the rotation brackets 251 and 252. For example, in a state in which the second pin members 273 and 274 are coupled with the hinge arms 271 and 272 facing the latitudinal direction of the electronic device 200 in the unfolded state of the electronic device 200 (e.g., FIG. 9B), the second pin members 273 and 274 may contact first side walls of the pin holes (e.g., the third holes 251*h* and 252*h*) of the rotation brackets 251 and 252. In a state in which the second pin members 273 and 274 are coupled with the hinge arms 271 and 272 facing the latitudinal direction of the electronic device 200 in the folded state of the electronic device 200 (e.g., FIG. 9C), the second pin members 273 and 274 may contact second side walls of the pin holes (e.g., the third holes 251*h* and 252*h*) of the rotation brackets 251 and 252. Compared to the "first sidewalls", the "second sidewalls" of the pin holes (e.g., the third holes 251*h* and 252*h*) may be close to the support member 244. According to an embodiment, as a mechanism of sliding the rotation arms 271 and 272 with respect to the rotation brackets 251 and 252 is implemented, damage of the flexible display 230 caused by the third and fourth rotation axes Ax3 and Ax4 different from the first and second rotation axes Ax1 and Ax2 may be prevented or reduced.

Figure 10A:
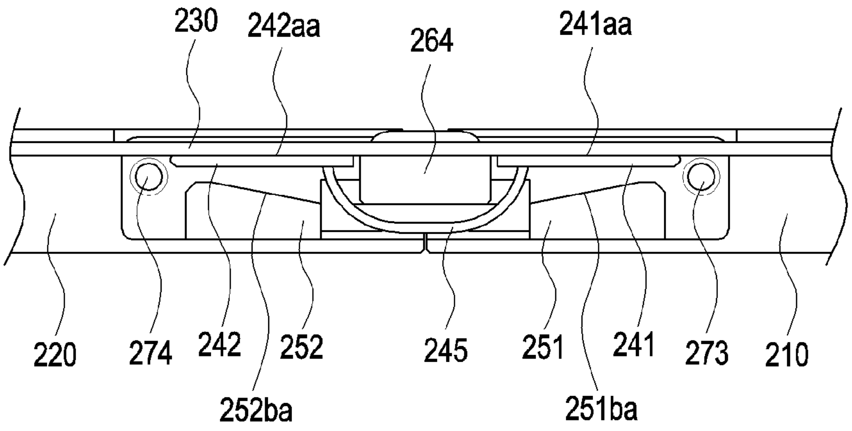
FIG. 10A is a cross-sectional view illustrating an electronic device in an unfolded state according to one or more embodiments.
Figure 10B:
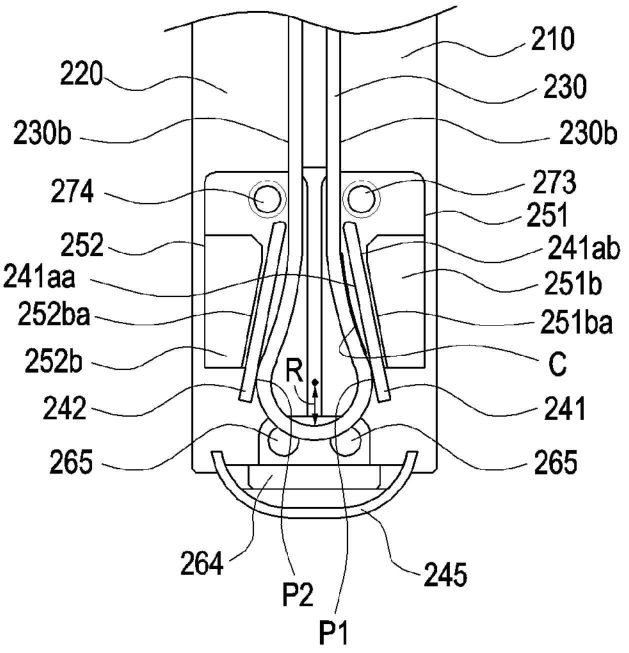
FIG. 10B is a cross-sectional view illustrating an electronic device in a folded state according to one or more embodiments.
Figure 11A:
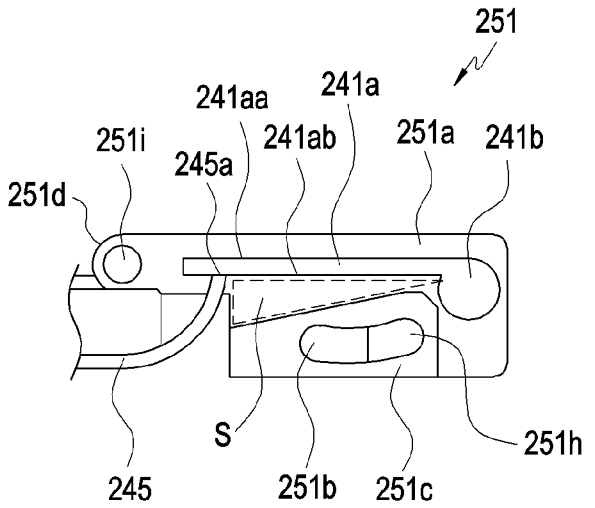
FIG. 11A is a diagram illustrating behaviors of a hinge plate and a rotation bracket in an unfolded state of an electronic device according to one or more embodiments.
Figure 11B:
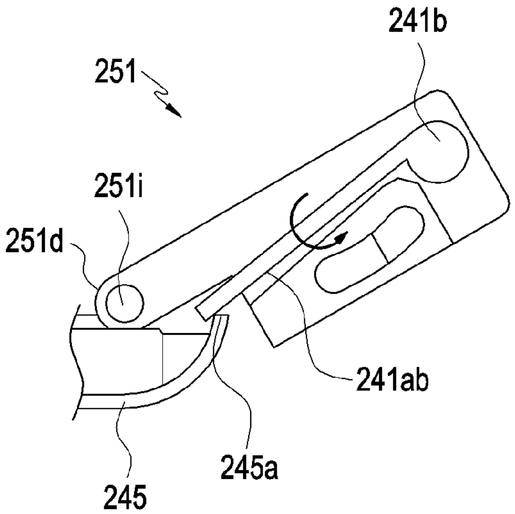
FIG. 11B is a diagram illustrating behaviors of a hinge plate and a rotation bracket in a folded state of an electronic device according to one or more embodiments.
Figure 11C:
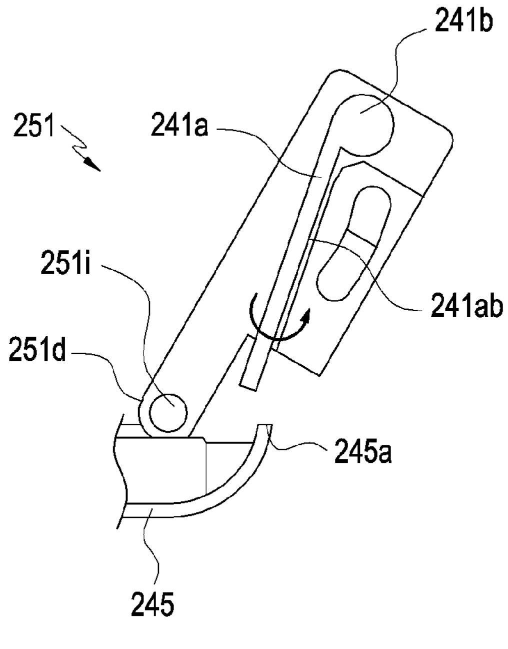
FIG. 11C is a diagram illustrating behaviors of a hinge plate and a rotation bracket in an electronic device folded further than in FIG. 11B according to one or more embodiments.
Figure 11D:
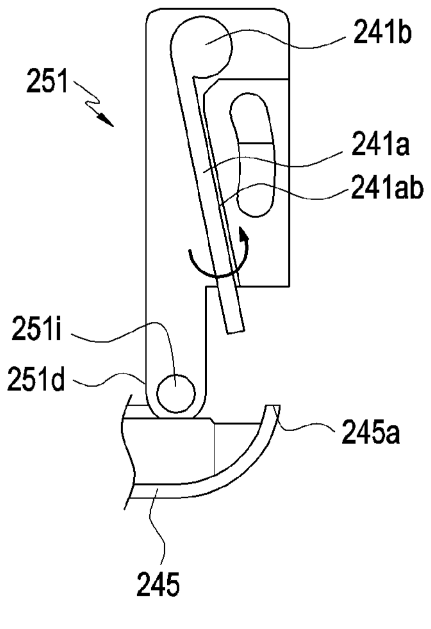
FIG. 11D is a diagram illustrating behaviors of a hinge plate and a rotation bracket in an electronic device folded further than in FIG. 11C according to one or more embodiments.

FIG. 10A is a cross-sectional view illustrating an electronic device in an unfolded state according to one or more embodiments. FIG. 10B is a cross-sectional view illustrating an electronic device in a folded state according to one or more embodiments. FIG. 11A is a diagram illustrating behaviors of a hinge plate and a rotation bracket in an unfolded state of an electronic device according to one or more embodiments. FIG. 11B is a diagram illustrating behaviors of a hinge plate and a rotation bracket in a folded state of an electronic device according to one or more embodiments. FIG. 11C is a diagram illustrating behaviors of a hinge plate and a rotation bracket in a further folded state of an electronic device than in FIG. 11B according to one or more embodiments. FIG. 11D is a diagram illustrating behaviors of a hinge plate and a rotation bracket in a further folded state of an electronic device than in FIG. 11C according to one or more embodiments.

Referring first to FIGS. 10A and 11A, the hinge plates 241 and 242 may support the flexible display 230 in the unfolded state of the electronic device. For example, in the unfolded state of the electronic device, top surfaces 241*aa* and 242*aa* of the hinge plates 241 and 242 may support the rear surface of the flexible display 230 (e.g., the rear surface 230*b* of the display 230 of FIG. 5). As the hinge plates 241 and 242 are allowed to support at least a part of the flexible display 230, when the user presses the vicinity of the folding area (e.g., the folding area 131*c* of FIG. 1) of the display 230 in the unfolded state of the flexible display 230, it is possible to prevent the display from sagging due to the hinge plates 241 and 242. According to another embodiment, a part of the hinge cover 245 may support at least a part of a hinge plate (e.g., the first hinge plate 241) as illustrated in FIG. 11A.

Referring back to FIG. 11A, in the unfolded state of the electronic device, at least parts of the hinge plates 241 and 242 may be supported by a part of the hinge cover 245, and the hinge plates 241 and 242 may have a specific space between the hinge plates 241 and 242 and the rotation brackets 251 and 252. The rotation brackets 251 and 252 may have one ends (e.g., the third arm 251*d*) having first pin structures (e.g., 265 in FIG. 6) fastened with the gear bracket (e.g., 264 in FIG. 6) (or fixing bracket), and be directed in a direction perpendicular to the hinge cover 245 by rotating in one direction during transitioning of the electronic device to the folded state, as illustrated in FIGS. 11B to 11D. The hinge plates 241 and 242 may also rotate at a specific angle, pass through the specific space S, and be seated on the inclined surfaces of the rotation brackets 251 and 252. For example, the first hinge plate 241 may include a first surface 241*aa* facing the flexible display and a second surface 241*ab* facing the opposite of the first surface 241*aa*, and rotate so that the second surface 241*ab* faces the inclined surfaces of the rotation brackets 251 and 252 during folding of the electronic device.

According to one or more embodiments of the disclosure, the foldable electronic device 200 may be provided with the hinge plates 241 and 242 rotatable around the third rotation axis Ax3 and the fourth rotation axis Ax4, aside from the first rotation axis Ax1 and the second rotation axis Ax2 for implementing the unfolded and folded state between the first housing structure 210 and the second housing structure 220.

Force that rotates the hinge plates 241 and 242 may be provided by reaction force formed by folding of the flexible display 230. For example, the flexible display 230 may have elastic repulsive force to be unfolded again in the folded state of the electronic device, and rotate the hinge plates 241 and 242 around the third rotation axis Ax3 and the fourth rotation axis Ax4 to face the inclined surfaces of the rotation brackets 251 and 252. In this case, at least parts of the hinge plates 241 and 242 may make line contact with the flexible display 230. For example, when the electronic device is folded, the flexible display 230 may also be folded, and thus a first part P1 and a second part P2 on the rear surface 230*b* of the flexible display 230 may contact parts of the hinge plates 241 and 242. Herein, parts of the rear surface 230*b* of the flexible display 230 at positions adjacent to the hinge plates 241 and 242 may be bent to form inverse curvature portions (or inverse curves) C. In the disclosure, as the behavior of the hinge plates 241 and 242 being inserted into the housing is applied, a space in which the flexible display 230 is foldable between the first housing 210 and the second housing may further be increased. Accordingly, a larger radius of curvature R with which the flexible display 230 is foldable may be formed. For example, the flexible display 230 may be implemented in the shape of a water droplet in its cross-section.

Figure 12:
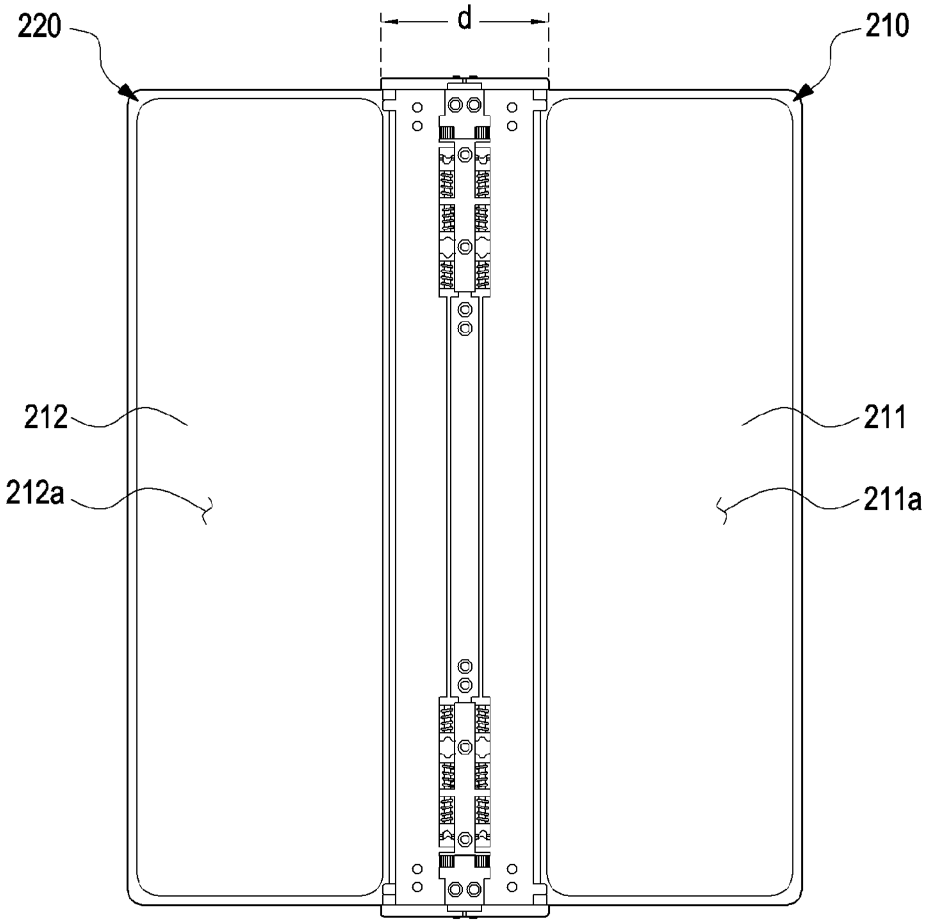
FIG. 12 is a diagram illustrating an electronic device according to one or more embodiments of the disclosure.

FIG. 12 is a diagram illustrating an electronic device 200 according to one or more embodiments of the disclosure.

In the embodiment illustrated in FIG. 12, the electronic device 200 with the display 230 removed therefrom may be shown.

As described above through the embodiments of FIGS. 4 to 11D, the electronic device 200 according to one or more embodiments of the disclosure discloses the hinge plates 241 and 242 rotatable around the third rotation axis Ax3 and the fourth rotation axis Ax4 provided separately from the first rotation axis Ax1 and the second rotation axis Ax1, and the rotation brackets 251 and 252 coupled with the hinge plates 241 and 242. According to one or more embodiments of the disclosure, the width d of the hinge module 240 may be reduced, thereby increasing a space for mounting components inside the electronic device 200. Further, according to one or more embodiments of the disclosure, the width d of the hinge module 240 may be reduced. In addition, adhesive attachment areas 211*a* and 212*a* of the plates 211 and 221 included in the electronic device 200 and supporting the display 230 may advantageously be made larger, thereby improving the durability of the electronic device 200.

According to one or more embodiments of the disclosure, a foldable electronic device (e.g., the foldable electronic device 200 of FIG. 4) may include: a first housing (e.g., the first housing 210 of FIG. 4); a second housing (e.g., the second housing 220 of FIG. 4); a hinge module (e.g., the hinge module 240 of FIG. 5) rotatably coupling the first housing and the second housing with each other; and a flexible display (e.g., the flexible display 230 of FIG. 5) disposed from one surface of the first housing to one surface of the second housing across an area in which the hinge module is disposed. The hinge module may include: a gear member; a first rotation bracket (e.g., the first rotation bracket 251 of FIG. 6) configured to be rotatably connected to the gear member using at least a part thereof; a second rotation bracket (e.g., the second rotation bracket 252 of FIG. 6) configured to be rotatably connected to the gear member using at least a part thereof; a first hinge plate (e.g., the first hinge plate 241 of FIG. 5) configured to be rotatably connected to the first rotation bracket by being coupled with at least a part of the first rotation bracket; and a second hinge plate (e.g., the second hinge plate 242 of FIG. 5) configured to be rotatably connected to the second rotation bracket by being coupled with at least a part of the second rotation bracket.

According to one or more embodiments, the gear member may include a first rotation axis (e.g., the first rotation axis Ax1 in FIG. 5) and a second rotation axis (e.g., the second rotation axis Ax2 in FIG. 5) to rotate the first housing and the second housing therearound.

According to one or more embodiments, the gear member may include: a first gear (e.g., the first gear 261 of FIG. 5) located on the first rotation axis; a second gear (e.g., the second gear 262 of FIG. 6) located on the second rotation axis, and further include an interlocking gear (e.g., the interlocking gear 263 of FIG. 6) interlocking the first gear and the second gear with each other.

According to one or more embodiments, the gear member may further include a fixing bracket (e.g., the fixing bracket

264 of FIG. 6) to fix a position of the first gear and to fix a position of the second gear by accommodating at least a part of the first gear and the second gear.

According to one or more embodiments, the foldable electronic device may further include a first pin member (e.g., the first pin member 273 of FIG. 6) fastening the fixing bracket to the first rotation bracket and the second rotation bracket.

According to one or more embodiments, each of the first rotation bracket and the second rotation bracket may include a base (e.g., the base 251*a* of FIG. 7B) and a plurality of arms (e.g., 251*b*, 251*c*, and 251*d* in FIG. 7B).

According to one or more embodiments, the first rotation bracket and the second rotation bracket may include a fastening member (e.g., the fastening member 251*e* of FIG. 7B) formed to protrude from one surface of the base in a longitudinal direction of the electronic device and fastening the first hinge plate and the second hinge plate to each other.

According to one or more embodiments, the fastening member may form a third rotation axis (e.g., the third rotation axis Ax3 in FIG. 5) and a fourth rotation axis (e.g., the fourth rotation axis Ax4 in FIG. 5) to rotate the first hinge plate and the second hinge plate rotate therearound.

According to one or more embodiments, each of the first rotation bracket and the second rotation bracket may include: a first arm (e.g., the first arm 251*b* of FIG. 7B) protruding from one surface of the base in a longitudinal direction of the electronic device; and a second arm (e.g., the second arm 251*c* of FIG. 7B) extending from the first arm in a direction parallel to the one surface of the base.

According to one or more embodiments, the foldable electronic device may include a guide pin hole (e.g., the guide pin hole 251*h* of FIG. 7B) formed on one surface of the second arm.

According to one or more embodiments, the hinge module may further include a first hinge arm (e.g., the first hinge arm 271 of FIG. 4) and a second hinge arm (e.g., the second hinge arm 272 of FIG. 4) rotating the first rotation bracket and the second rotation bracket in response to an unfolded or folded state of the first housing and the second housing.

According to one or more embodiments, the foldable electronic device may further include a second pin member (e.g., the second pin members 273 and 274 of FIG. 6) fastening the first hinge arm and the second hinge arm to the guide pin hole (e.g., the first guide pin hole 251*h* and the second guide pin hole 252*h* of FIG. 6).

According to one or more embodiments, the gear member may include: a first gear including a first teeth portion (e.g., the first teeth portion 261*a* of FIG. 7C) and a first shaft (e.g., the first shaft 261*b* of FIG. 7C) connected to the first teeth portion;

and a second gear including a second teeth portion and a second shaft connected to the second teeth portion, and the first hinge arm and the second hinge arm may be fixedly connected to the first shaft and the second shaft, respectively.

According to one or more embodiments, the first hinge arm and the second hinge arm may be fixed by press-fitting of an asymmetric cross-sectional structure of an end of the first shaft (e.g., the end 261*c* of the first shaft in FIG. 7C) and an asymmetric cross-sectional structure of an end of the second shaft.

According to one or more embodiments, the first hinge plate and the second hinge plate may be at least partially supported by a hinge cover of the hinge module, when the electronic device is in an unfolded state.

According to one or more embodiments of the disclosure, a foldable electronic device (e.g., the foldable electronic device 200 of FIG. 4) may include: a first housing (e.g., the first housing 210 of FIG. 4); a second housing (e.g., the second housing 220 of FIG. 4); a hinge module (e.g., the hinge module 240 of FIG. 5) rotatably coupling the first housing and the second housing with each other; and a flexible display (e.g., the flexible display 230 of FIG. 5) disposed from one surface of the first housing to one surface of the second housing across an area in which the hinge module is disposed. The hinge module may include: a gear member; a first rotation bracket (e.g., the first rotation bracket 251 of FIG. 6) configured to be rotatably connected to the gear member using at least a part thereof; a second rotation bracket (e.g., the second rotation bracket 252 of FIG. 6) configured to be rotatably connected to the gear member using at least a part thereof; a first hinge arm (e.g., the first hinge arm 271 of FIG. 6) rotating the first rotation bracket in response to rotation of the first housing and the second housing; a second hinge arm (e.g., the second hinge arm 272 of FIG. 6) rotating the second rotation bracket in response to rotation of the first housing and the second housing; a first hinge plate (e.g., the first hinge plate 241 of FIG. 6) configured to be rotatably connected to the first rotation bracket by being coupled with at least a part of the first rotation bracket; and a second hinge plate (e.g., the second hinge plate 242 of FIG. 6) configured to be rotatably connected to the second rotation bracket by being coupled with at least a part of the second rotation bracket. Each of first hinge plate and the second hinge plate is configured to rotate using a rotation axis (e.g., the third rotation axis Ax3 and the fourth rotation axis Ax4) different from a rotation axis (e.g., the first rotation axis Ax1 and the second rotation axis Ax2 in FIG. 5) around which the first housing and the second housing rotate.

According to one or more embodiments, the rotation axis (e.g., the third rotation axis Ax3 and the fourth rotation axis Ax4) around which the first hinge plate and the second hinge plate are rotatable may be located on a rear surface of the flexible display (e.g., the rear surface 230*b* of the flexible display in FIG. 10B).

According to one or more embodiments, when the electronic device is in an unfolded state, at least a part (e.g., 245*a* in FIG. 11A) of the first hinge plate and the second hinge plate may be supported by a hinge cover of the hinge module.

According to one or more embodiments, the gear member may include: a first gear (e.g., the first gear 261 of FIG. 6) located on the first rotation axis; and a second gear (e.g., the second gear 262 of FIG. 6) located on the second rotation axis (e.g., the second rotation axis Ax2 in FIG. 5), and further include an interlocking gear (e.g., the interlocking gear 263 of FIG. 6) interlocking the first gear and the second gear with each other.

According to one or more embodiments, the gear member may further include a fixing bracket (e.g., the fixing bracket 264 of FIG. 6) to fix positions of the first gear and the second gear by accommodating at least a part of the first gear and the second gear.

While specific embodiments have been described above in the detailed description of the disclosure, it will be apparent to those skilled in the art that many modifications can be made without departing from the scope of the disclosure.

What is claimed is:

1. A foldable electronic device comprising:

a first housing;

a second housing;

a hinge module rotatably coupling the first housing and the second housing with each other; and a flexible display extending from one surface of the first housing to one surface of the second housing across an area in which the hinge module is disposed, wherein the hinge module comprises:

a gear member comprising a first rotation axis to rotate the first housing and a second rotation axis to rotate the second housing;

a first rotation bracket rotatably connected to the gear member;

a second rotation bracket rotatably connected to the gear member;

a first hinge plate rotatably connected to the first rotation bracket by being coupled with at least a part of the first rotation bracket; and a second hinge plate rotatably connected to the second rotation bracket by being coupled with at least a part of the second rotation bracket, wherein each of the first rotation bracket and the second rotation bracket comprises a base, a plurality of arms, and a fastening portion protruding from one surface of the base in a longitudinal direction of the foldable electronic device, wherein the fastening portion of the first rotation bracket is formed to fasten the first hinge plate and the first rotation bracket to each other, and the fastening portion of the second rotation bracket is formed to fasten the second hinge plate and the second rotation bracket to each other, wherein the fastening portion of the first rotation bracket forms a third rotation axis to rotate the first hinge plate therearound and the fastening portion of the second rotation bracket forms a fourth rotation axis to rotate the second hinge plate therearound, wherein the gear member comprises a first gear and a second gear, wherein the hinge module further comprises:

a first hinge arm connected to the first gear; and a second hinge arm connected to the second gear, wherein the first hinge arm and the second hinge arm are configured to respectively rotate the first rotation bracket and the second rotation bracket in response to an unfolding or a folding of the first housing and the second housing, wherein the first gear comprises a first teeth portion and a first shaft connected to the first teeth portion, wherein the second gear comprises a second teeth portion and a second shaft connected to the second teeth portion, wherein the first hinge arm and the second hinge arm are fixedly connected to the first shaft and the second shaft, respectively, and wherein the first hinge arm and the second hinge arm are fixed by press-fitting of an asymmetric cross-sectional structure of an end of the first shaft and an asymmetric cross-sectional structure of an end of the second shaft.

2. The foldable electronic device of claim 1, wherein the hinge module is configured to rotate the first housing around the first rotation axis and to rotate the second housing around the second rotation axis.

3. The foldable electronic device of claim 2, wherein wherein the first gear is aligned with the first rotation axis and the second gear aligned with the second rotation axis, and wherein the hinge module further comprises an interlocking gear interlocking the first gear and the second gear with each other.

4. The foldable electronic device of claim 3, wherein the gear member further comprises a fixing bracket configured to fix a position of the first gear by accommodating at least a part of the first gear and to fix a position of the second gear by accommodating at least a part of the second gear.

5. The foldable electronic device of claim 4, further comprising a first pin member fastening the fixing bracket to the first rotation bracket and the second rotation bracket.

6. The foldable electronic device of claim 1, wherein the plurality of arms of each of the first rotation bracket and the second rotation bracket comprises:

a first arm protruding from the one surface of the base in the longitudinal direction of the foldable electronic device; and a second arm extending from the first arm in a direction parallel to the one surface of the base.

7. The foldable electronic device of claim 6, wherein the second arm of each of the first rotation bracket and the second rotation bracket comprises a guide pin hole formed in a surface of the second arm.

8. The foldable electronic device of claim 7, wherein the foldable electronic device further comprises a pair of second pin members respectively fastening the first hinge arm and the second hinge arm to the guide pin hole of the first rotation bracket and the guide pin hole of the second rotation bracket.

9. The foldable electronic device of claim 1, wherein the first hinge plate and the second hinge plate are at least partially supported by a hinge cover of the hinge module, when the foldable electronic device is in an unfolded state.

10. The foldable electronic device of claim 1, wherein each of the first hinge plate and the second hinge plate is configured to rotate using a rotation axis different from a rotation axis around which the first housing and the second housing rotate, and wherein the rotation axis around which the first hinge plate and the second hinge plate are rotatable is located on a rear surface of the flexible display.

11. A foldable electronic device comprising:

a first housing;

a second housing;

a hinge module rotatably coupling the first housing and the second housing with each other; and a flexible display disposed on a first surface of the first housing and a second surface of the second housing, and extending between the first surface and the second surface across the hinge module, wherein the hinge module comprises:

a gear member comprising a first rotation axis to rotate the first housing and a second rotation axis to rotate the second housing;

a first rotation bracket rotatably connected to the gear member;

a second rotation bracket rotatably connected to the gear member;

a first hinge plate rotatably connected to the first rotation bracket by being coupled with at least a part of the first rotation bracket; and a second hinge plate rotatably connected to the second rotation bracket by being coupled with at least a part of the second rotation bracket, wherein each of the first rotation bracket and the second rotation bracket comprises a base, a plurality of arms, and a fastening portion protruding from one surface of the base in a longitudinal direction of the foldable electronic device, wherein the fastening portion of the first rotation bracket is formed to fasten the first hinge plate and the first rotation bracket to each other, and the fastening portion of the second rotation bracket is formed to fasten the second hinge plate and the second rotation bracket to each other, wherein the fastening portion of the first rotation bracket forms a third rotation axis to rotate the first hinge plate therearound and the fastening portion of the second rotation bracket forms a fourth rotation axis to rotate the second hinge plate therearound, wherein each of the first rotation bracket and the second rotation bracket comprises a first arm formed to protrude from the one surface of the base in the longitudinal direction of the foldable electronic device, a second arm extending from the first arm in a direction parallel to the one surface of the base, and a guide pin hole formed on one surface of the second arm, wherein the gear member comprises a first gear and a second gear, wherein the hinge module further comprises:

a first hinge arm connected to the first gear; and a second hinge arm connected to the second gear, wherein the first hinge arm and the second hinge arm are configured to respectively rotate the first rotation bracket and the second rotation bracket in response to an unfolding or a folding of the first housing and the second housing, wherein the first gear comprises a first teeth portion and a first shaft connected to the first teeth portion, wherein the second gear comprises a second teeth portion and a second shaft connected to the second teeth portion, wherein the first hinge arm and the second hinge arm are fixedly connected to the first shaft and the second shaft, respectively, and wherein the first hinge arm and the second hinge arm are fixed by press-fitting of an asymmetric cross-sectional structure of an end of the first shaft and an asymmetric cross-sectional structure of an end of the second shaft.

* * * * *